(12) United States Patent
Ishihara et al.

(10) Patent No.: US 10,271,430 B2
(45) Date of Patent: Apr. 23, 2019

(54) PRINTED WIRING BOARD HAVING SUPPORT PLATE AND METHOD FOR MANUFACTURING PRINTED WIRING BOARD HAVING SUPPORT PLATE

(71) Applicant: IBIDEN CO., LTD., Ogaki (JP)

(72) Inventors: Teruyuki Ishihara, Ogaki (JP); Hiroyuki Ban, Ogaki (JP); Haiying Mei, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/682,721

(22) Filed: Aug. 22, 2017

(65) Prior Publication Data

US 2018/0054890 A1 Feb. 22, 2018

(30) Foreign Application Priority Data

Aug. 22, 2016 (JP) ................. 2016-161869

(51) Int. Cl.
| | |
|---|---|
| H05K 1/11 | (2006.01) |
| H05K 1/02 | (2006.01) |
| H05K 1/03 | (2006.01) |
| H05K 1/18 | (2006.01) |
| H05K 3/02 | (2006.01) |
| H05K 3/06 | (2006.01) |
| H05K 3/46 | (2006.01) |
| H05K 3/40 | (2006.01) |
| H05K 3/24 | (2006.01) |

(Continued)

(52) U.S. Cl.
CPC .......... *H05K 1/113* (2013.01); *H05K 1/0298* (2013.01); *H05K 1/0313* (2013.01); *H05K 1/181* (2013.01); *H05K 3/025* (2013.01); *H05K 3/06* (2013.01); *H05K 3/4007* (2013.01); *H05K 3/465* (2013.01); *H05K 3/4682* (2013.01); *H05K 3/243* (2013.01); *H05K 3/284* (2013.01); *H05K 3/3436* (2013.01); *H05K 2201/0338* (2013.01); *H05K 2201/10378* (2013.01); *Y02P 70/611* (2015.11)

(58) Field of Classification Search
CPC .... H05K 1/0298; H05K 1/113; H05K 1/0313; H05K 1/181; H05K 3/025; H05K 3/06
USPC ........................................ 361/760
See application file for complete search history.

(56) References Cited

U.S. PATENT DOCUMENTS

2017/0094797 A1* 3/2017 Baek .................... H05K 3/4697

FOREIGN PATENT DOCUMENTS

JP 2009-224739 A 10/2009

* cited by examiner

*Primary Examiner* — Tremesha S Willis
(74) *Attorney, Agent, or Firm* — Oblon, McClelland, Maier & Neustadt, L.L.P.

(57) ABSTRACT

A printed wiring board includes a support plate, a laminate formed on the support plate and including first conductor pads on first surface side of the laminate and first via conductors on second surface side of the laminate, and a solder resist layer interposed between the plate and the laminate and having openings formed such that the openings are exposing the first pads. The laminate has first surface on the first surface side and second surface on the second surface side on the opposite side and includes a first resin insulating layer forming the second surface of the laminate, and the first conductors are formed through the first insulating layer such that the first vias are tapering from the first surface side toward the second surface side of the laminate and have end surfaces recessed from the second surface of the laminate on the second surface side of the laminate.

14 Claims, 17 Drawing Sheets

(51) Int. Cl.
*H05K 3/28* (2006.01)
*H05K 3/34* (2006.01)

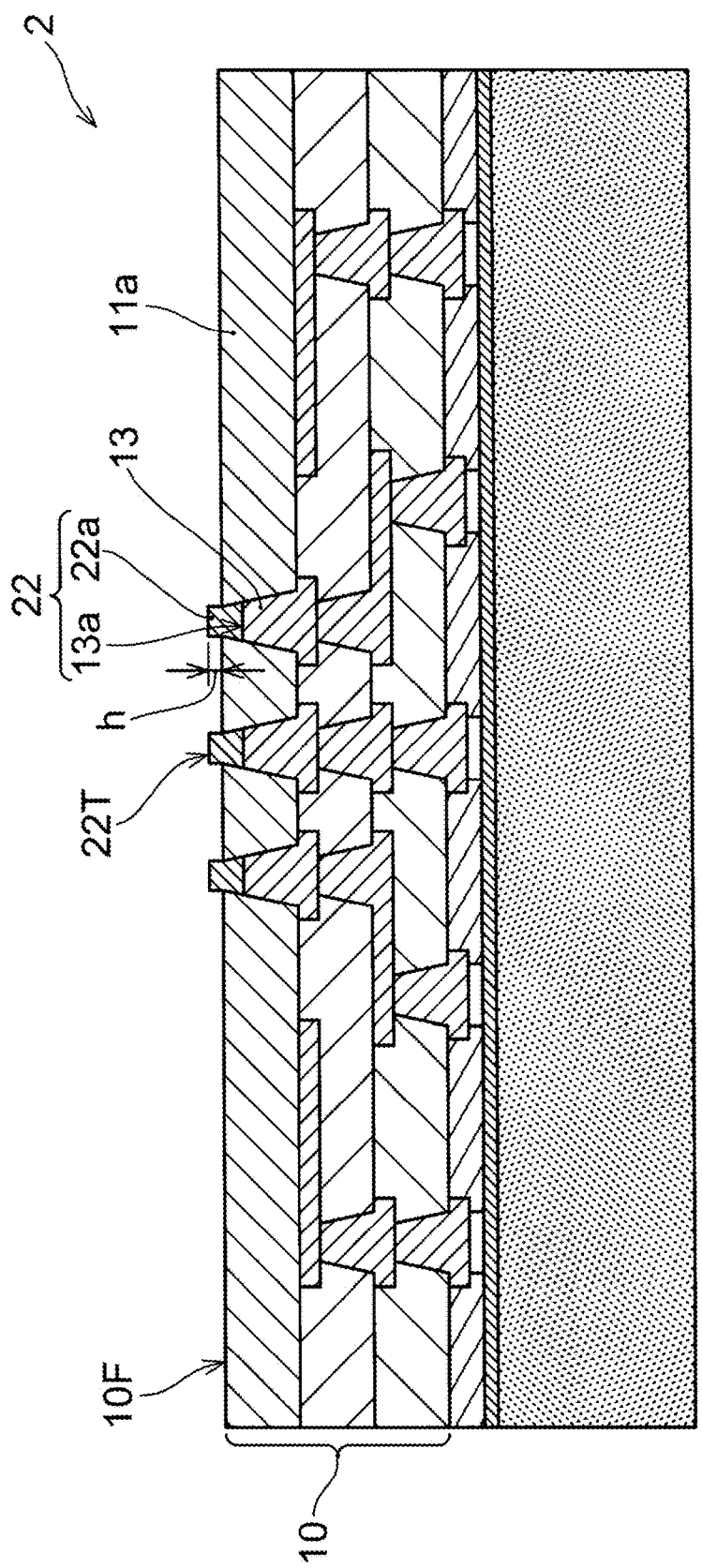

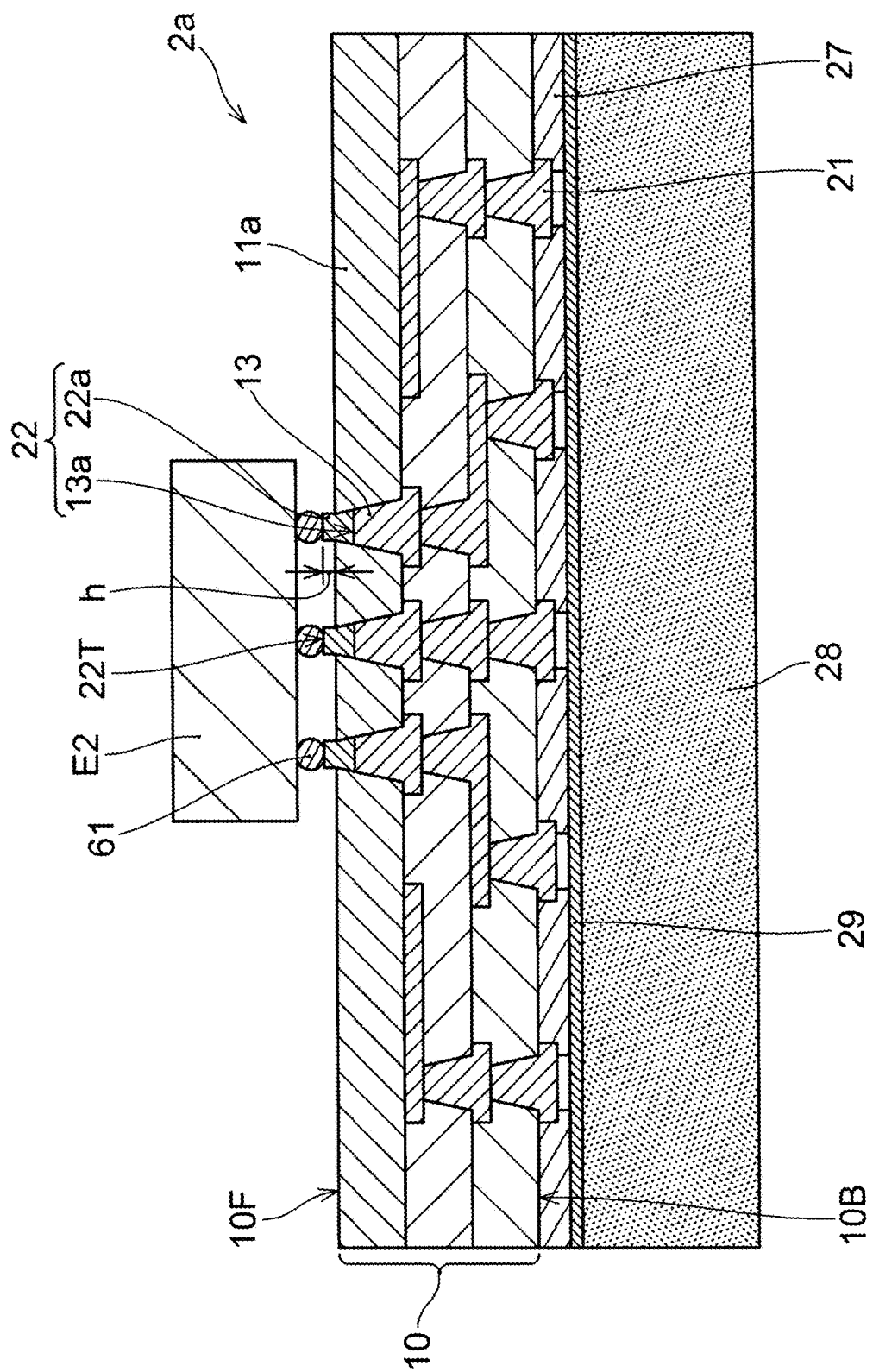

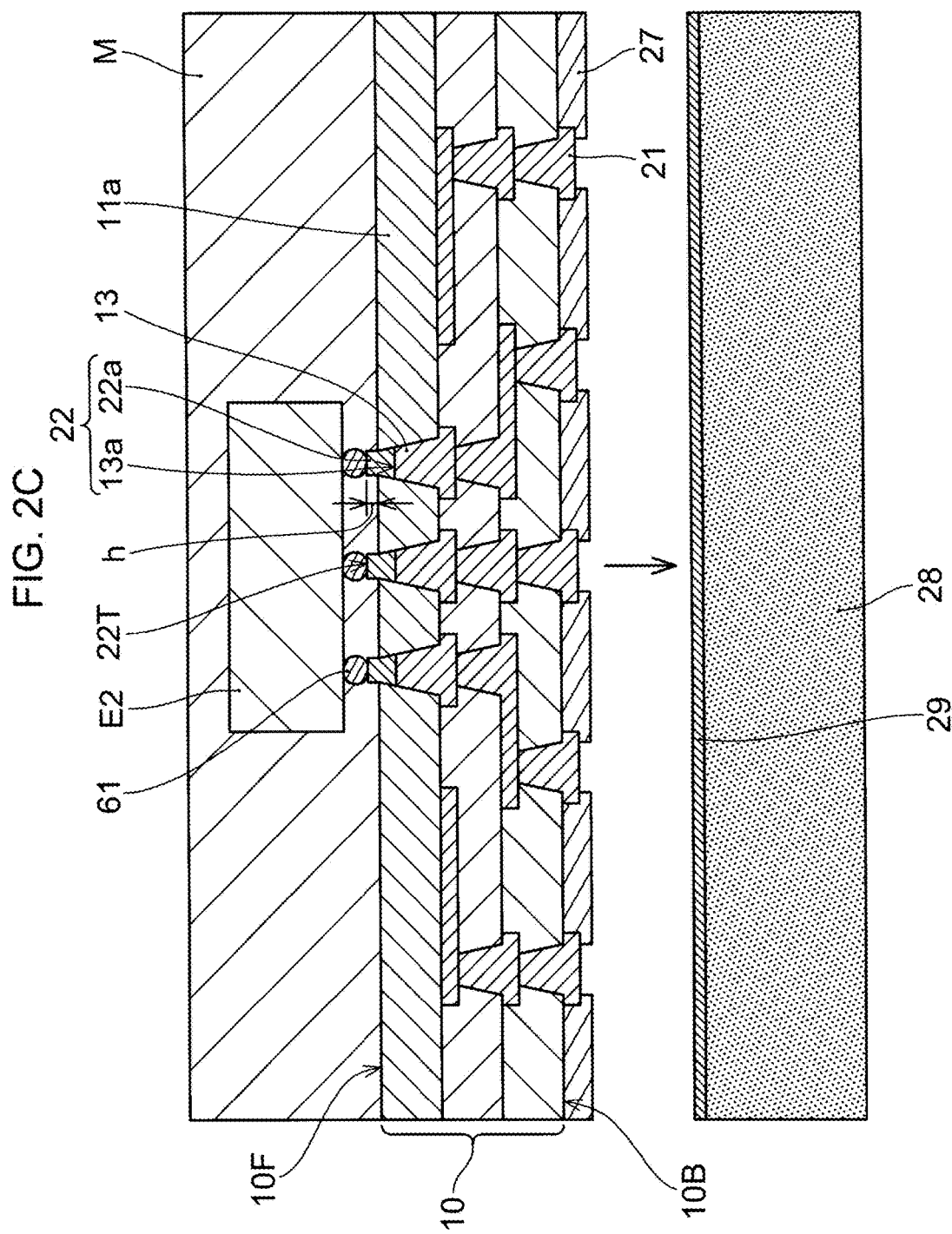

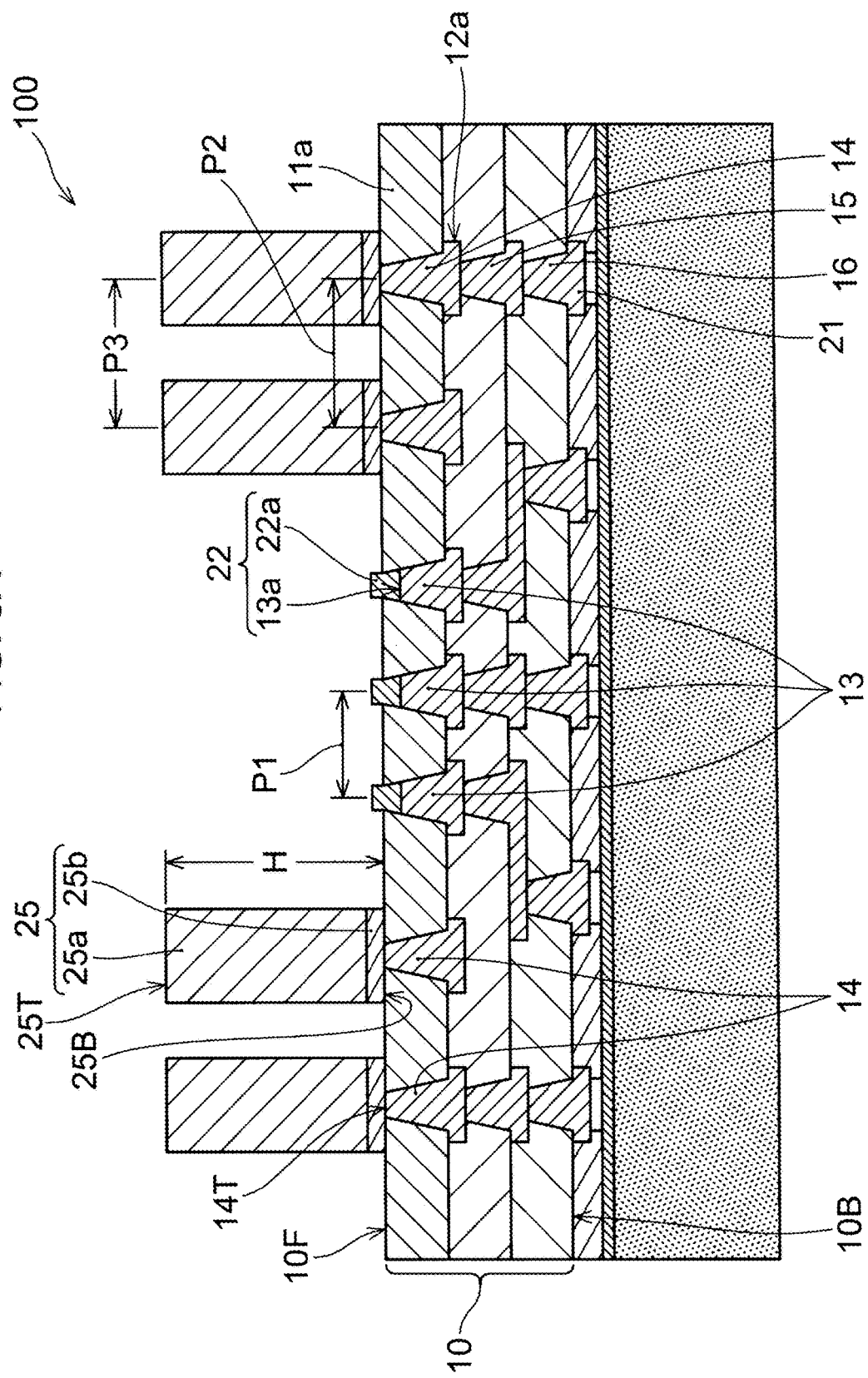

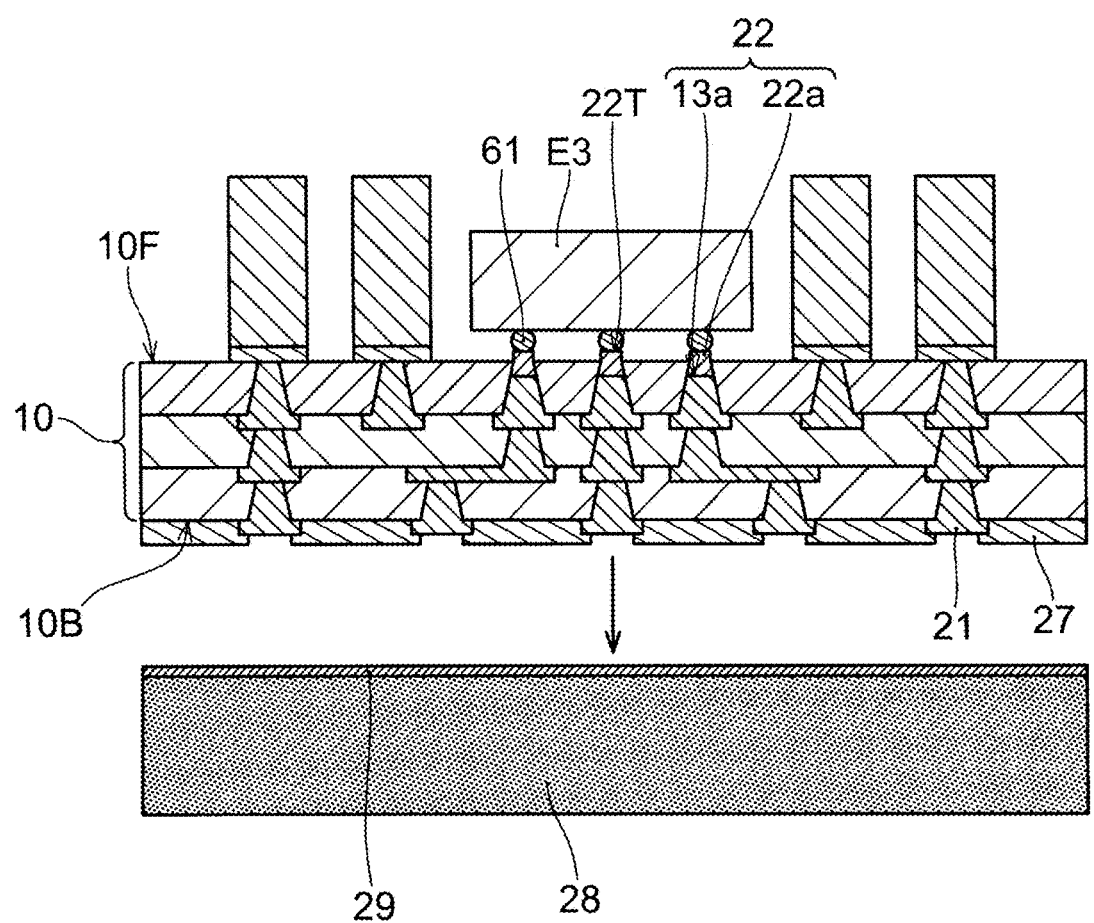

PRINTED WIRING BOARD HAVING SUPPORT PLATE AND METHOD FOR MANUFACTURING PRINTED WIRING BOARD HAVING SUPPORT PLATE

CROSS-REFERENCE TO RELATED APPLICATIONS

The present application is based upon and claims the benefit of priority to Japanese Patent Application No. 2016-161869, filed Aug. 22, 2016, the entire contents of which are incorporated herein by reference.

BACKGROUND OF THE INVENTION

Field of the Invention

The present invention relates to a printed wiring board having a support plate and relates to a method for manufacturing the printed wiring board.

Description of Background Art

Japanese Patent Laid-Open Publication No. 2009-224739 describes a multilayer wiring board that does not have a core substrate. The multilayer wiring board of Japanese Patent Laid-Open Publication No. 2009-224739 includes a laminate obtained by laminating an insulating layer and a wiring layer. On a semiconductor element mounting surface side of the multilayer wiring board, connection pads for connecting electrodes of a semiconductor element are formed on an insulating layer that forms the mounting surface, and a protective film is formed such that the connection pads are exposed. The entire contents of this publication are incorporated herein by reference.

SUMMARY OF THE INVENTION

According to one aspect of the present invention, a printed wiring board includes a support plate, a laminate formed on the support plate and including first conductor pads on a first surface side of the laminate and first via conductors on a second surface side of the laminate, and a solder resist layer interposed between the support plate and the laminate and having openings formed such that the openings are exposing the first conductor pads respectively. The laminate has a first surface on the first surface side and a second surface on the second surface side on the opposite side with respect to the first surface of the laminate and includes a first resin insulating layer forming the second surface of the laminate, and the first via conductors are formed through the first resin insulating layer such that the first via conductors are tapering from the first surface side toward the second surface side of the laminate and have end surfaces recessed from the second surface of the laminate on the second surface side of the laminate respectively.

According to another aspect of the present invention, a method for manufacturing a printed wiring board includes preparing a base plate having a metal foil on a surface of the base plate, forming, on the metal foil on the base plate, at least one set of a resin insulating layer and a conductor layer, such that the laminate includes a first resin insulating layer laminated on the metal foil and is formed to have a first surface and a second surface on a metal foil side on the opposite side with respect to the first surface, forming a solder resist layer on the first surface of the laminate, positioning a support plate on the first surface of the lami- nate such that the solder resist layer is interposed between the laminate and the support plate, removing the base plate from the laminate, and etching the metal foil on the laminate such that the metal foil is removed from the laminate. The forming of the laminate includes forming first via conductors through the first resin insulating layer and forming an outermost conductor layer including first conductor pads on a first surface side of the laminate, and the removing of the metal foil includes exposing end surfaces of the first via conductors and forming the end surfaces of the first via conductors recessed from the second surface of the laminate respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A is a cross-sectional view of a printed wiring board according to another embodiment of the present invention;

FIG. 2B illustrates a printed wiring board according to an embodiment of the present invention in which an electronic component is mounted;

FIG. 2C illustrates a printed wiring board according to an embodiment of the present invention in which the electronic component is mounted;

FIG. 3A is cross-sectional view illustrating a printed wiring board according to yet another embodiment of the present invention;

FIG. 4S illustrates an example of removing a support plate in a method for manufacturing a printed wiring board according to the embodiment of the present invention.

DETAILED DESCRIPTION OF THE EMBODIMENTS

Figure 1A:
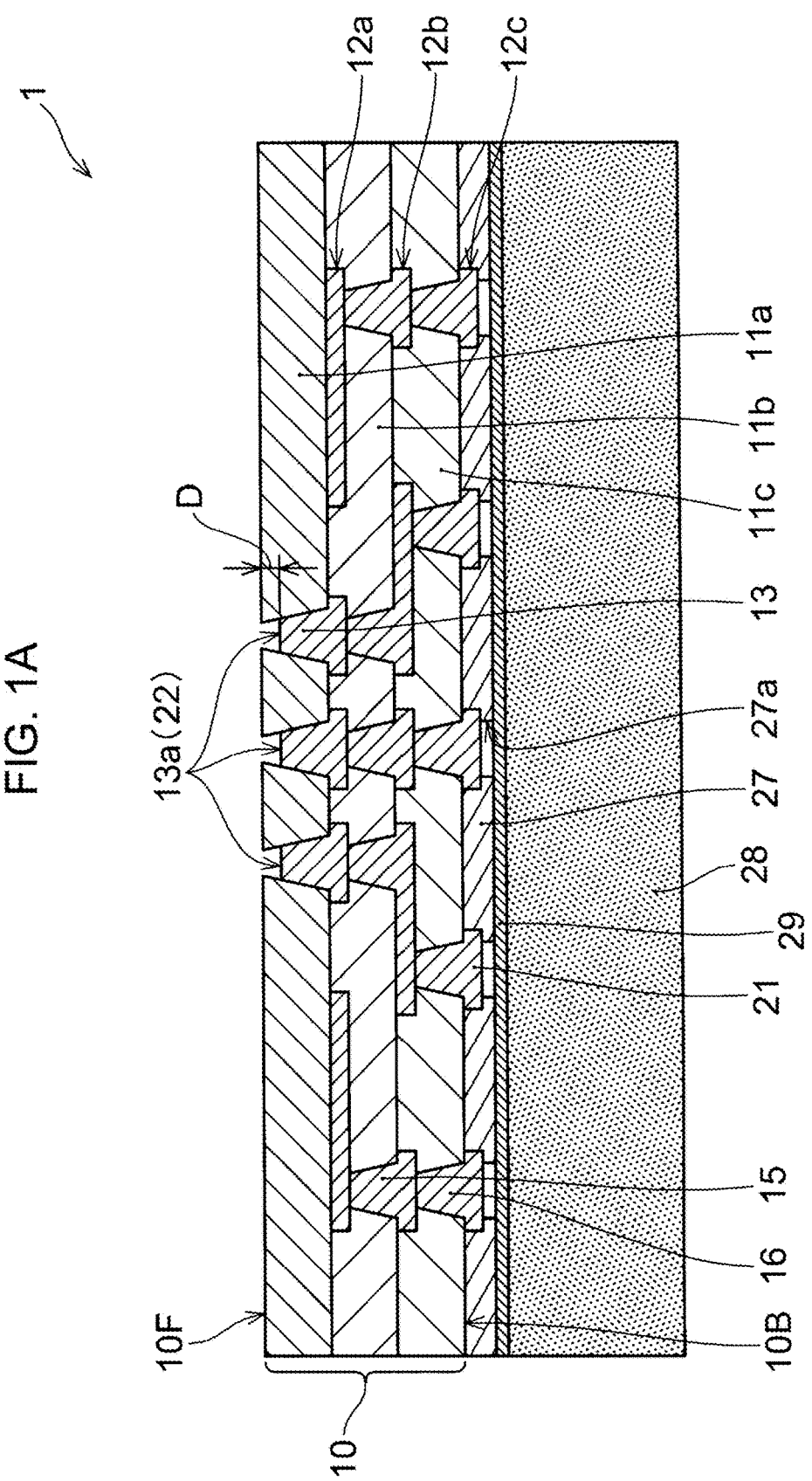
FIG. 1A is a cross-sectional view of a printed wiring board according to an embodiment of the present invention.

Embodiments will now be described with reference to the accompanying drawings, wherein like reference numerals designate corresponding or identical elements throughout the various drawings.

FIG. 1A illustrates a cross-sectional view of an example of a printed wiring board 1 of the embodiment. As illustrated in FIG. 1A, the printed wiring board 1 includes a laminate 10 formed from alternately laminated conductor layers and resin insulating layers. In the example of FIG. 1A, the laminate 10 is formed by alternately laminating first-third resin insulating layers (11a, 11b, 11c) and first-third conductor layers (12a, 12b, 12c). The laminate 10 has a first surface (10B) and a second surface (10F) that is on the opposite side of the first surface (10B). The first surface (10B) is formed from a surface of a resin insulating layer (the third resin insulating layer (11c) in the example of FIG. 1A) that forms a surface on one side in a lamination direction of the laminate 10, and the second surface (10F) is formed from a surface of a resin insulating layer (the first resin insulating layer (11a) in the example of FIG. 1A) exposed on the other side in the lamination direction of the laminate 10. Multiple first conductor pads 21 are formed on the first surface (10B) of the laminate 10. As illustrated in FIG. 1A, the first conductor pads 21 are formed on the first surface (10B) without being embedded in the third resin insulating layer (11c) that forms the first surface (10B) of the laminate 10. That is, the first conductor pads 21 are formed protruding on the first surface (10B). On the second surface (10F) side of the laminate 10, end surfaces (13a) of first via conductors 13 on the opposite side of the first conductor layer (12a) (on the second surface (10F) side) are exposed, the first via conductors 13 being formed in the first resin insulating layer (11a) that forms the second surface (10F) of the laminate 10. The end surfaces (13a) of the first via conductors 13 are recessed from the second surface (10F) of the laminate 10. Further, a solder resist layer 27 is forming on the first surface (10B) of the laminate 10. The solder resist layer 27 has openings (27a) that respectively expose the first conductor pads 21. A support plate 28 is provided on the first surface (10B) of the laminate 10 with the solder resist layer 27 sandwiched therebetween.

The first conductor pads 21 are formed in the third conductor layer (12c) that is positioned on the most first surface (10B) side among the conductor layers of the laminate 10. The end surfaces (13a) of the first via conductors 13 are exposed on the second surface (10F) side and form connection pads 22 that can be connected to an external electrical circuit. For example, an electronic component (for example, an electronic component (E1); see FIG. 1B) or an external wiring board (not illustrated in the drawings) is connected to the connection pads 22. Examples of the electronic component include a bare chip of a semiconductor element, a WLP, and integrated circuit devices of other forms. Examples of the external wiring board include a motherboard of an electrical device in which the printed wiring board 1 is used, a wiring board of a package of an external electronic component.

In the printed wiring board 1 of the embodiment, the support plate 28 is provided on the first surface (10B) of the laminate 10. Therefore, warpage or deflection of the printed wiring board 1 is suppressed. For example, when an electronic component is mounted on the connection pads 22 formed on the second surface (10F) side of the laminate 10, multiple electrodes of the electronic component can be respectively substantially uniformly brought close to the multiple connection pads 22. The electrodes of the electronic component are unlikely to float from the connection pads 22. Since flatness of the second surface (10F) of the laminate 10 is maintained, positional deviation of an electronic component to be mounted is unlikely to occur. Further, since the printed wiring board 1 is unlikely to deflect, in such a component mounting process or in a manufacturing process of the printed wiring board 1 itself, the printed wiring board 1 can be easily handled.

As will be described later, the support plate 28 can be provided on the first surface (10B) of the laminate 10 via the solder resist layer 27 after the conductor layers and the resin insulating layers in the laminate 10 are formed. Therefore, the support plate 28 can be attached to the laminate 10, for example, after performing an energization inspection of an electrical circuit (not illustrated in the drawings) formed by conductor patterns of the conductor layers. That is, it is possible to provide a support plate 28 only for a laminate 10 that is determined to be non-defective by an energization inspection. Then, the electronic component (E1) can be mounted on the laminate 10 that is supported by the support plate 28 and has proper energizing performance.

Specifically, terminals of the electronic component (E1) or the like connected to the connection pads 22 are connected to the end surfaces (13a) of the first via conductors 13 exposed on the second surface (10F) side, that is, the connection pads 22, via bonding members 61 (see FIG. 1B) formed of solder or the like. In the present embodiment, the first via conductors 13 are embedded in the first resin insulating layer (11a), and the end surfaces (13a) on the second surface (10F) side are recessed from the second surface (10F) of the laminate 10. That is, insulating partition walls due to the first resin insulating layer (11a) are interposed between the connection pads 22. Therefore, wet spreading of solder or the like provided on the connection pads 22 is suppressed. A short-circuit defect is unlikely to occur between adjacent connection pads 22. A depth (D) (see FIG. 1A) of the recesses of the end surfaces (13*a*) of the first via conductors 13 from the second surface (10F) of the laminate 10 is not particularly limited. However, as will be described below, the recesses of the end surface (13*a*) from the second surface (10F) are formed, for example, by etching exposed surfaces of the first via conductors 13 that are exposed on the second surface (10F) of the laminate 10. Therefore, it is preferable that the depth (D) of the recesses be such that an excessively long etching time is not required. For example, the depth (D) of the recesses of the end surface (13*a*) from the second surface (10F) is 10 µm or less, and preferably, 5 µm or less. From a point of view of obtaining the above-described effect of suppressing a short-circuit defect, the depth (D) of the recesses is preferably 1 µm or more. In the example of FIG. 1A, the second surface (10F) of the laminate 10 is exposed without being covered by a solder resist. In this way, even when a solder resist layer is not formed on the second surface (10F) and even when the connection pads 22 are arrayed at a fine pitch, an electronic component or the like can be connected with good quality on the second surface (10F).

The first conductor pads 21 of the printed wiring board 1 can also be connected to an external electrical circuit such as an electronic component or a motherboard. In this case, the support plate 28 is removed before the connection. Or, openings are formed to expose some predetermined first conductor pads 21 to be connected to the external electrical circuit. As illustrated in FIG. 1A, the printed wiring board 1 has the solder resist layer 27 on the first surface (10B) of the laminate 10. Therefore, in connection between the first conductor pads 21 and an external electrical circuit, occurrence of a short-circuit defect due to solder or the like between the first conductor pads 21 is suppressed.

In this way, in the present embodiment, a short-circuit defect due to solder or the like can be suppressed on both the surface on one side (for example, the first surface (10B) of the laminate 10) and the surface on the other side (for example, the second surface (10F) of the laminate 10) of the printed wiring board 1. Further, the connection pads 22 and an external electrical circuit can be connected on the printed wiring board 1 having good flatness by being supported by the support plate 28. An electrical device using the printed wiring board 1 of the embodiment and having high connection quality can be obtained. As will be described below, the support plate 28 is preferably adhered to the solder resist layer 27 via an adhesive layer 29 that does not develop a strong adhesive force between the support plate 28 and the solder resist layer 27.

The laminate 10 has a laminated structure similar to that of a so-called build-up part in a build-up wiring board. In the laminate 10 of FIG. 1A, the conductor layers and the resin insulating layers are laminated in the order of, from the first surface (10B) side, the third conductor layer (12*c*), the third resin insulating layer (11*c*), the second conductor layer (12*b*), the second resin insulating layer (11*b*), the first conductor layer (12*a*), and the first resin insulating layer (11*a*). However, the laminate 10 of the printed wiring board of the embodiment can be formed by any number of conductor layers and resin insulating layers. The number of the laminating layers can be appropriately selected according to a circuit structure. For example, the laminate 10 may include one conductor layer and one resin insulating layer, or may include more than three conductor layers and more than three resin insulating layers. By allowing the laminate 10 to include more conductor layers, without increasing a planar size of the printed wiring board 1, a larger and more complex electrical circuit can be formed in the printed wiring board 1. Further, it is also possible that the laminate 10 is formed by laminating some conductor layers and some resin insulating layers at one time rather than forming the conductor layers and the resin insulating layers one by one as in a build-up wiring board.

The conductor layers in the laminate 10 each have conductor patterns formed by patterning pads, wirings and the like into predetermined shapes. The conductor layers are each formed of a good conductive material such as copper. The resin insulating layers in the laminate 10 are not particularly limited as long as the resin insulating layers are insulating and each have adhesion to a conductor layer, an appropriate thermal expansion coefficient, and the like. For example, an epoxy resin can be used for the formation of the resin insulating layers.

As illustrated in FIG. 1A, third via conductors 15 and fourth via conductors 16 respectively electrically connect between the conductor patterns in the first conductor layer (12*a*) and the conductor patterns in the second conductor layer (12*b*), and between the conductor patterns in the second conductor layer (12*b*) and the conductor patterns in the third conductor layer (12*c*). End surfaces of the first via conductors 13 on the first surface (10B) side of the laminate 10 are connected to the conductor patterns in the first conductor layer (12*a*). The first via conductors 13, the third via conductors 15, and the fourth via conductors 16 are respectively formed in the first resin insulating layer (11*a*), the second resin insulating layer (11*b*), and the third resin insulating layer (11*c*). The via conductors are preferably formed of the same material as the first-third conductor layers (12*a*-12*c*).

As will be described later, the via conductors are respectively formed in conduction holes that are formed, for example, by irradiating laser from one side of a respective resin insulating layer. The conduction holes each have a diameter that is larger on a laser irradiation side and become smaller on a deep side (opposite side of the laser irradiation side). In the example illustrated in FIG. 1A, since laser is irradiated from a lower side in the drawing, the diameter (width) on the lower side of each of the conduction holes is larger and the diameter (width) on an upper side is smaller. Therefore, in the example illustrated in FIG. 1A, first, third, fourth via conductors 13, 15, 16 are each gradually reduced in diameter from the first surface (10B) side of the laminate 10 toward the second surface (10F) side of the laminated 10. That is, a size of a cross section of each of the via conductors in a plane orthogonal to a thickness direction of the laminate 10 is larger closer to the first surface (10B) side and smaller closer to the second surface (10F) side. Of each of the via conductors, an end surface on the second surface (10F) side is smaller than an end surface on the first surface (10B) side. Since the end surface (13*a*) of each of the first via conductors 13 on the second surface (10F) side is small, the small-diameter connection pads 22 are obtained. Since gaps between the connection pads 22 are widened, occurrence of a short-circuit defect is further suppressed. The term "reduced in diameter" is used for convenience only. A cross-sectional shape of each of the via conductors is not limited to a circle or an ellipse, but may also be a rectangle. The term "reduced in diameter" means that a cross-sectional area decreases.

In the example of FIG. 1A, the solder resist layer 27 is formed between the first conductor pads 21. The solder resist layer 27 covers edges of the first conductor pads 21, and in each of the openings (27a), a central portion of a first conductor pad 21 is exposed. Due to the solder resist layer 27 formed between the first conductor pads 21, a short-circuit defect between the first conductor pads 21 is prevented with a high probability. Further, it is also possible that the openings (27a) of the solder resist layer 27 each expose an entire first conductor pad 21. Further, it is also possible that the solder resist layer 27 is formed such that the multiple first conductor pads 21 are collectively exposed in one opening (27a). The solder resist layer 27 can be formed of, for example, a photosensitive epoxy resin or polyimide resin. Different from the example of FIG. 1A, it is also possible that a solder resist layer is formed also on the second surface (10F) of the laminate 10. Occurrence of a short-circuit defect on the second surface (10F) is further suppressed.

The support plate 28 is adhered to the solder resist layer 27 by an adhesive that forms the adhesive layer 29. The support plate 28 is formed of a rigid material, and supports the laminate 10 such that warpage or deflection of the printed wiring board 1 can be suppressed. The support plate 28 is formed of, for example, a metal plate, a glass epoxy plate obtained by impregnating a reinforcing material such as glass fiber with an epoxy resin, or a copper-clad laminated plate having a copper foil on both sides of a glass epoxy substrate, or the like. Besides these, any appropriately rigid material can be used for the support plate 28. The support plate 28 has a thickness of, for example, 100 µm or more and 500 µm or less. The laminate 10 is properly supported and the printed wiring board 1 including the support plate 28 does not become extremely thick.

A material that forms the adhesive layer 29 is not particularly limited as long as the material can closely adhere to the support plate 28 and the solder resist layer 27. In the case where a part of the support plate 28 or the entire support plate 28 is removed during use of the printed wiring board 1, a material that has moderate adhesiveness but does not develop a strong adhesive force with respect to the solder resist layer 27 and the third conductor layer (12c) is preferred as the material of the adhesive layer 29. A material at least capable of developing a stronger adhesive force with respect to the support plate 28 than with respect to the solder resist layer 27 and the third conductor layer (12c) is preferred as the material of the adhesive layer 29. It is also possible that the material that forms the adhesive layer 29 is a material that loses adhesiveness with respect to the solder resist layer 27 and the third conductor layer (12c) due to a specific treatment such as ultraviolet irradiation or heating. For example, an acrylic resin can be used as the material of the adhesive layer 29.

Although not illustrated in the drawings, it is also possible that the support plate 28 and the adhesive layer 29 are provided with openings that respectively communicatively connect with the openings (27a) of the solder resist layer 27 and expose the first conductor pads 21. When an energization inspection of the printed wiring board 1 is performed after the support plate 28 is adhered, it is possible that ease of the energization inspection and defect detection performance are improved. Further, it is also possible that the connection between the first conductor pads 21 and the external electrical circuit is facilitated. In this case, the support plate 28 is preferably an electrical insulator.

Figure 1B:
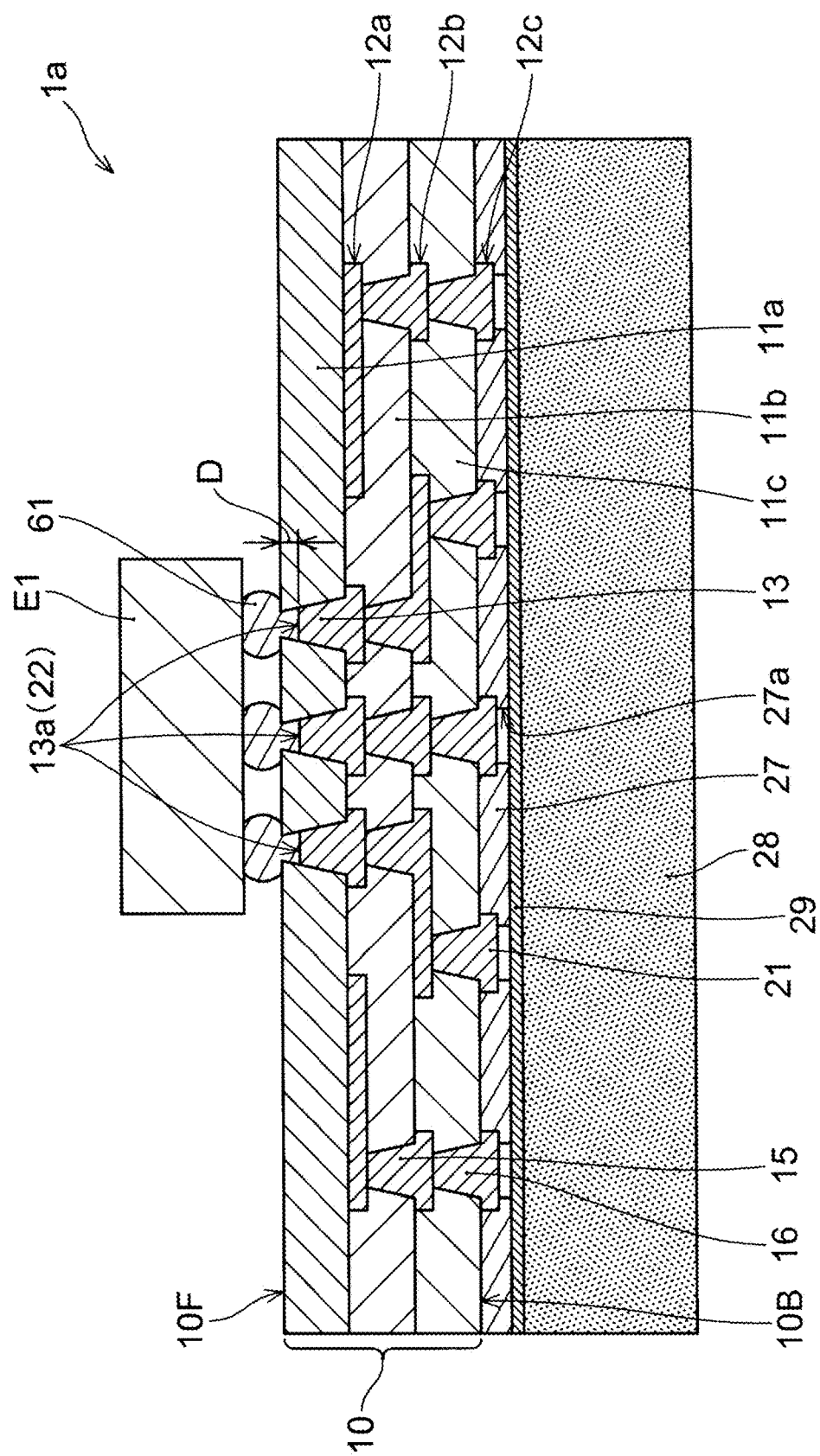
FIG. 1B illustrates a printed wiring board according to an embodiment of the present invention in which an electronic component is mounted.

FIG. 1B illustrates a printed wiring board (1a) having an electronic component (E1) connected to the connection pads 22 of the printed wiring board 1. Due to the support plate 28 provided on the first surface (10B), warpage or deflection of the printed wiring board (1a) is suppressed. Therefore, when the electronic component (E1) is mounted, multiple electrodes of the electronic component (E1) can be respectively substantially uniformly brought close to the multiple connection pads 22. The electrodes of the electronic component (E1) are unlikely to float from the connection pads 22. Terminals of the electronic component (E1) are respectively connected to exposed surfaces of the connection pads 22 on the opposite side of the first surface (10B) via bonding members 61 formed of solder or the like. For example, a semiconductor element or the like of a CSP or bare chip type is mounted as the electronic component (E1) on the connection pads 22.

A surface treatment layer may be formed on each of the end surfaces (13a) of the first via conductors 13 to prevent corrosion of the end surfaces (13a). That is, the connection pads 22 may each include a surface treatment layer. This example is illustrated in FIG. 2A. A printed wiring board 2 of another embodiment illustrated in FIG. 2A has the same structure at the printed wiring board 1 illustrated in FIG. 1A except that the connection pads 22 each includes a surface treatment layer (22a). A structural element that is the same as in the printed wiring board 1 is indicated using the same reference numeral symbol as in FIG. 1A, and description about the structural element is omitted.

The surface treatment layer (22a) is, for example, a corrosion resistant plating layer formed of highly corrosion resistant gold or the like. Corrosion resistance of the connection pads 22 is likely to be improved. The surface treatment layer (22a) may be formed of two or more metal layers. An outermost layer (layer on the opposite side of the respective first via conductor 13) of the surface treatment layer (22a) is preferably formed of a metal having low contact resistance and high corrosion resistance. Corrosion resistance and oxidation resistance of the connection pads 22 are improved. For example, during mounting of an electronic component or the like, a solder connection defect caused by oxidation of the connection pads is unlikely to occur. For example, the surface treatment layer (22a) includes, in order from the outermost layer side, a gold layer and a nickel layer. Further, the surface treatment layer (22a) may include, in order from a far side from the first surface (10B), a gold layer, a palladium layer, and a nickel layer. The surface treatment layer (22a) can be formed to have a thickness of, for example, 2 µm or more and 10 µM or less.

As illustrated in FIG. 2A, upper surfaces (22T) of the surface treatment layers (22a) on the opposite side of the first via conductors 13 may be formed protruding from the second surface (10F) of the laminate 10. The end surfaces (13a) of the first via conductors 13 are recessed from the second surface (10F) of the laminate 10. That is, interfaces between the surface treatment layers (22a) and the end surfaces (13a) of the first via conductors 13 are not coplanar with the second surface (10F) of the laminate 10. Even when an external force in a direction parallel to the second surface (10F) is applied to portions of the surface treatment layers (22a) protruding from the second surface (10F), since the first via conductors 13 and the end surfaces (13a) are embedded in the first resin insulating layer (11a), a crack or peeling is unlikely to occur at the interfaces between the surface treatment layers (22a) and the end surfaces (13a). A height (h) of the upper surfaces (22T) of the surface treatment layers (22a) from the second surface (10F) is, for example, 1 µm or more and 5 µm or less. When the height (h) is such a length, mounting of an electronic component (E2) (see FIG. 2B) to the connection pads 22 is facilitated. A mounting yield of the electronic component is expected to be high. Further, a stress caused by a difference between a thermal expansion coefficient of the electronic component and a thermal expansion coefficient of the printed wiring board 2 can be relaxed.

FIG. 2B illustrates an example of a printed wiring board (2a) that includes the electronic component (E2) connected to the connection pads 22 that include the surface treatment layers (22a). Similar to the example illustrated in FIG. 1B, terminals of the electronic component (E2) are respectively connected, for example, via bonding members 61 formed of solder or the like, to the upper surfaces (22T) of the connection pads 22 that include the surface treatment layers (22a). Similar to the example illustrated in FIG. 1B, the electronic component (E2) is, for example, a semiconductor element, a passive element or the like.

The support plate 28 may be peeled off from the laminate 10 after the electronic component (E2) is mounted. This example is illustrated in FIG. 2C. By peeling off the support plate 28, the first conductor pads 21 are exposed. The first conductor pads 21 can be easily connected to an external electrical circuit. As illustrated in FIG. 2C, a resin sealing layer (M) covering around the electronic component (E2) may be formed.

As illustrated in FIG. 3A, in the first resin insulating layer (11a), in addition to the first via conductors 13, multiple second via conductors 14 penetrating the first resin insulating layer (11a) may be formed. The multiple second via conductors 14 may have an array pitch different from that of the multiple first via conductors 13. Further, the second via conductors 14 can be provided for connecting to an external element other an electronic component or the like connected to the connection pads 22.

FIG. 3A illustrates a printed wiring board 100 of an example of a yet another embodiment in which the multiple second via conductors 14 are provided on outer periphery of the first via conductors 13. The printed wiring board 100 has the same structure as the printed wiring board 2 of FIG. 2A except that the printed wiring board 100 has the second via conductors 14 and conductor posts 25 on the second via conductors 14, and that the printed wiring board 100 has a first conductor layer (12a) that includes a conductor pattern different from that of FIG. 2A for connecting to the second via conductors 14. A structural element that is the same as in the printed wiring board 2 is indicated using the same reference numeral symbol as in FIG. 2A, and description about the structural element is omitted.

As illustrated in FIG. 3A, the second via conductors 14 are formed on an outer peripheral side of the second surface (10F) of the laminate 10 than the multiple first via conductors 13 that are formed in a central portion of the first resin insulating layer (11a) of the laminate 10. The multiple second via conductors 14 can be formed, for example, over the entire circumference of the multiple first via conductors 13 so as to surround the first via conductors 13. It is also possible that the multiple second via conductors 14 are formed only on both sides of the multiple first via conductors 13 in one direction along the second surface (10F) (for example, a left-right direction in FIG. 3A).

Similar to the first via conductors 13, end surfaces of the second via conductors 14 on the first surface (10B) side of the laminate 10 are connected to the conductor patterns in the first conductor layer (12a). As illustrated in FIG. 3A, end surfaces (14T) of the second via conductors 14 on the second surface (10F) side of the laminate 10 may be substantially coplanar with the second surface (10F) of the laminate 10. For example, the second via conductors 14 may be covered by the first resin insulating layer (11a) except for the end surfaces (14T).

Figure 3B:
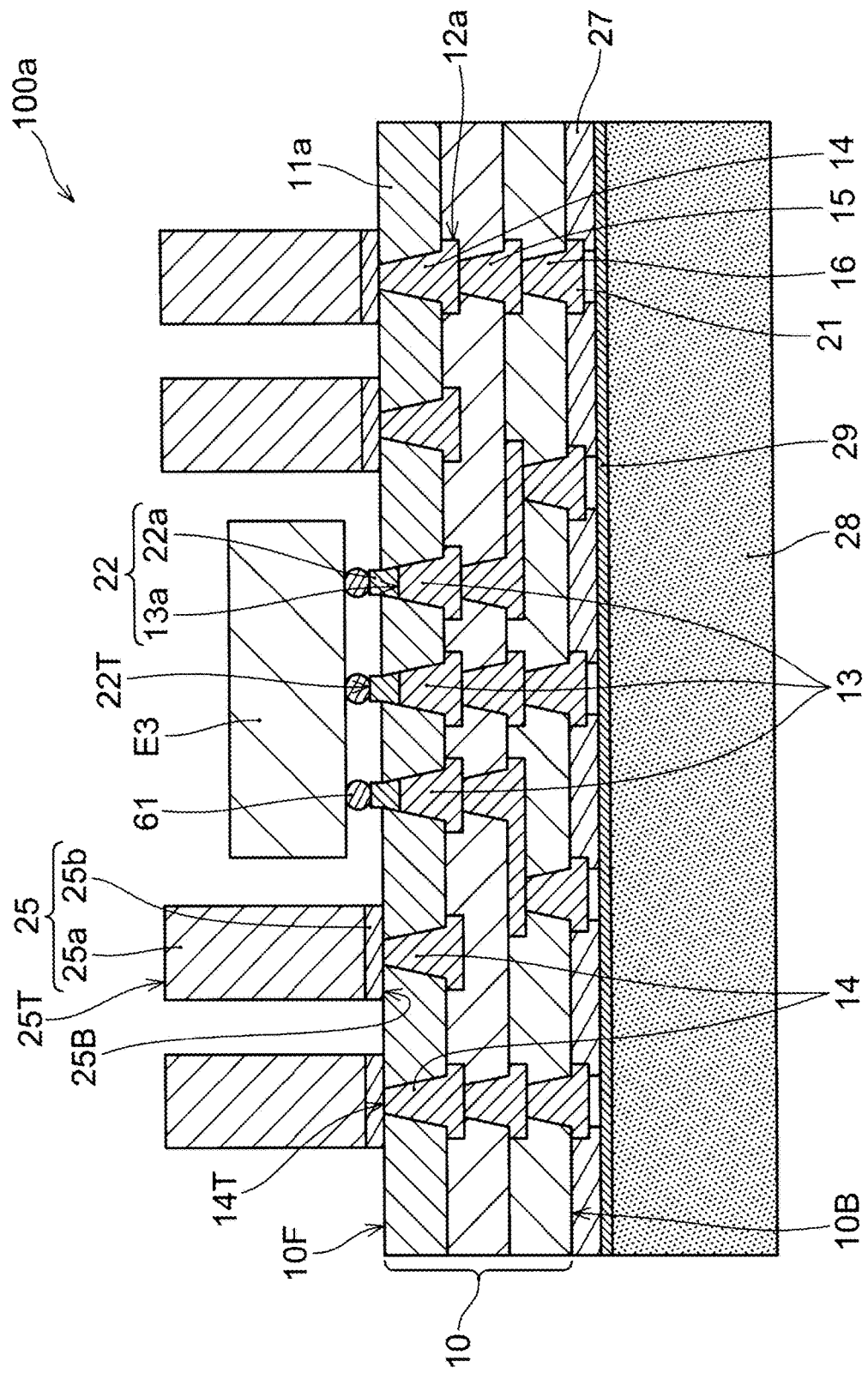
FIG. 3B illustrates a printed wiring board according to yet another embodiment of the present invention in which an electronic component is mounted.

As illustrated in FIG. 3A, the multiple first via conductors 13 and the multiple second via conductors 14 respectively have array pitches (P1, P2). Here, the term "pitch" refers to a distance between centers of adjacent via conductors or the like. In the example of FIG. 3A, the pitch (P1) of the first via conductors 13 is smaller than the pitch (P2) of the second via conductors 14. For example, an electronic component (E3) (see FIG. 3B) such as a semiconductor element of a CSP or bare chip type having terminals arrayed at a relatively narrow pitch, or a semiconductor element of which a terminal pitch is not widened by a rewiring layer such as an interposer, can be directly connected to the connection pads 22.

In the example of FIG. 3A, the conductor posts 25 are respectively formed on the end surfaces (14T) of the multiple second via conductors 14. The conductor posts 25 are columnar bodies that are formed of a conductive material and each have an arbitrary bottom surface (end surface) shape. For example, an external electronic component or a wiring board (not illustrated in the drawings) is connected to end surfaces 25T of the conductor posts 25 on the opposite side of the laminate 10. That is, the laminate 10 and an external electrical circuit (not illustrated in the drawings) can be connected to each other via the conductor posts 25. However, it is also possible that, without forming the conductor posts 25 on the end surfaces (14T), the end surfaces (14T) form connection pads, and an electronic component is connected on the end surfaces (14T). The second via conductors 14 can be connected to any external element. Since the pitch (P2) of the second via conductors 14 is larger than the pitch (P1) of the first via conductors 13, for example, a large BGA or the like having terminals arrayed at a relatively large pitch can be connected to the second via conductors 14. For example, a BGA (not illustrated in the drawings) or the like having terminals only on an outer peripheral portion thereof may be mounted on the end surfaces (14T) of the second via conductors 14 in a manner straddling over the electronic component (E3) such as a semiconductor element of a CSP or bare chip type having a small size connected via the connection pads 22. An electronic component of a package-on-package type including multiple semiconductor devices or the like that are hierarchically mounted can be formed. In any case, in the printed wiring board 100, electronic components can be mounted at a high density. Or, it is also possible that one electronic component is mounted on the first via conductors 13 and the second via conductors 14. Further, instead of an electronic component, a motherboard of an electrical device in which the printed wiring board 100 is used, or an external wiring board such as a wiring board of a package of an external electronic component, may be connected to the first via conductors 13 and the second via conductors 14. As will be described later, the first via conductors 13 and the second via conductors 14 can be appropriately formed according to the electronic component (E3) or an external wiring board or the like to be mounted on the printed wiring board 100 of the embodiment.

In the example of FIG. 3A, the conductor posts 25 are each formed from a metal foil layer (25b) and a plating film layer (25a), the metal foil layer (25b) facing the laminate 10 and being in contact with a second via conductor 14, and the plating film layer (25a) being formed on the metal foil layer (25b). The end surfaces (14T) of the second via conductors 14, on which the conductor posts 25 are respectively formed, are substantially coplanar with the second surface (10F) of the laminate 10. That is, interfaces between the second via conductors 14 and the metal foil layers (25b) are substantially coplanar with the second surface (10F) of the laminate 10. The metal foil layer (25b) is formed of, for example, a metal foil such as a copper foil or a nickel foil. Examples of a material for the plating film layer (25a) include copper, nickel and the like, but are not limited to these. Preferably, the plating film layer (25a) is formed of an electrolytic copper plating film.

The conductor posts 25 can be formed to have any height, for example, according to a thickness of the electronic component (E3) to be mounted on the connection pads 22. FIG. 3B illustrates an example of a printed wiring board (100a) that includes the electronic component (E3) connected to the connection pads 22. Similar to the examples illustrated in FIGS. 1B and 2B, terminals of the electronic component (E3) are respectively connected to the connection pads 22, for example, via bonding members 61 formed of solder or the like. For example, a height (H) of the conductor posts 25 is 50 μm or more and 200 μm or less. A relatively thick electronic component (E3) can be mounted on the connection pads 22. Further, the conductor posts 25 can be formed within a relatively short time by electrolytic plating or the like. Further, a stress caused by a difference between a thermal expansion coefficient of an external wiring board or electronic component mounted on the end surfaces (25T) of the conductor posts 25 and a thermal expansion coefficient of the printed wiring board 100 is relaxed by the conductor posts 25. Even when the printed wiring board (100a) in a package-on-package is subjected to heat cycles, connection between an electronic component or the like and the printed wiring board 100 can be stable for a long period of time. The height (H) of the conductor posts 25 is a distance from an interface between an end surface (14T) of a second via conductor 14 and a metal foil layer (25b) to an end surface (25T) of a conductor post 25.

The multiple conductor posts 25 have an array pitch (P3). For example, the array pitch (P3) of the conductor posts 25 is substantially the same as the array pitch (P2) of the second via conductors 14. In the example of FIG. 3A, the array pitch (P3) of the conductor posts 25 is larger than the array pitch (P1) of the connection pads 22.

The conductor posts 25 are connected to predetermined conductor patterns in the laminate 10 via the second via conductors 14. Structurally, the conductor posts 25 can be connected to any conductor pads or wiring patterns in any conductor layer in the laminate 10. As in the case of leftmost and rightmost conductor posts in FIG. 3A, a conductor post 25, a second via conductor 14, a third via conductor 15, a fourth via conductor 16 and a first conductor pad 21 may all be formed at overlapping positions in a plan view and connected to each other. That is, a conductor post 25 may be connected to a first conductor pad 21 via second-fourth via conductors (14, 15, 16) that are formed at overlapping positions in a plan view, that is, so-called stacked vias. For example, all of these may be substantially coaxially formed. An external wiring board or the like connected to the end surfaces (25T) of the conductor posts 25 can be electrically connected with a short path to an external motherboard or the like connected to the first conductor pads 21. However, it is also possible that stacked vias connecting a conductor post 25 to a first conductor pad 21 are not formed. The term "plan view" refers to a way of viewing the printed wiring board 100 from outside, and means to view the printed wiring board 100 along a direction parallel to a thickness direction of the printed wiring board 100.

The conductor posts 25 each have a diameter of, for example, 75 μm or more and 200 μm or less. In the example of FIG. 3A, a diameter of the end surface (14T) of each of the second via conductors 14 is smaller than a diameter of an end surface (25B) of each of the conductor posts 25 on the laminate 10 side. For example, the diameter of the end surface (14T) of each of the second via conductors 14 is 30 μm or more and 70 μm or less. The diameter of each of the conductor posts 25 is a longest distance between any two points on an outer circumference of an end surface of each of the conductor posts 25. The diameter of the end surface (14T) of each of the second via conductors 14 is a longest distance between any two points on an outer circumference of the end surface (14T) of each of the second via conductors 14. For example, when the conductor posts 25 are each a cylindrical body, the diameter of each of the conductor posts 25 is a diameter of an end surface of each of the conductor posts 25.

Next, an example of a method for manufacturing a printed wiring board of the embodiment is described with reference to FIG. 4A-4S using the printed wiring board 100 illustrated in FIG. 3A as an example.

Figure 4A:
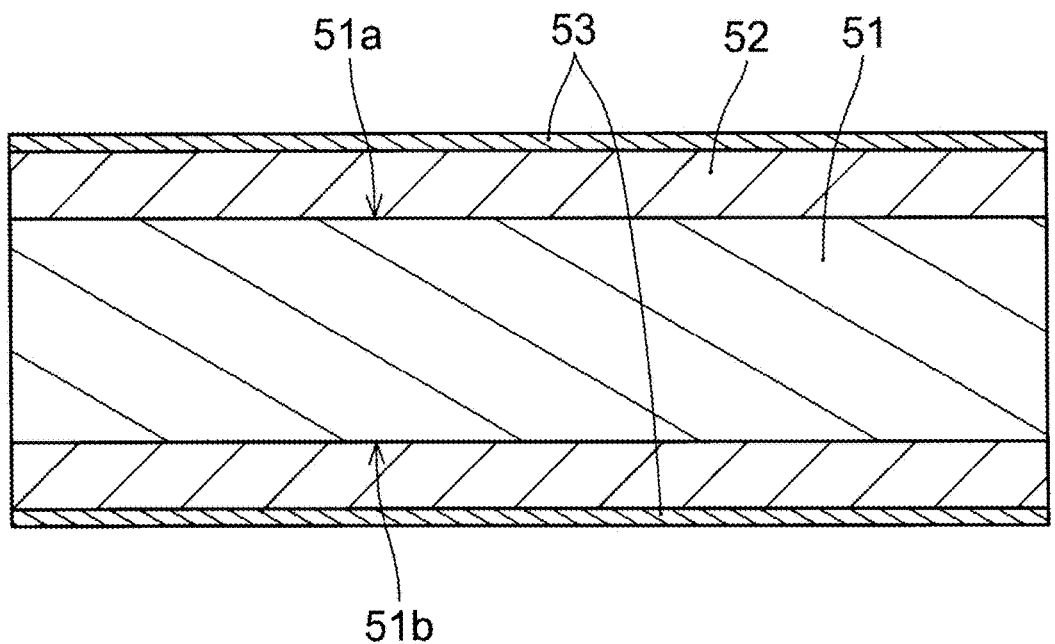
FIG. 4A illustrates a method for manufacturing a printed wiring board according to an embodiment of the present invention.
Figure 4B:
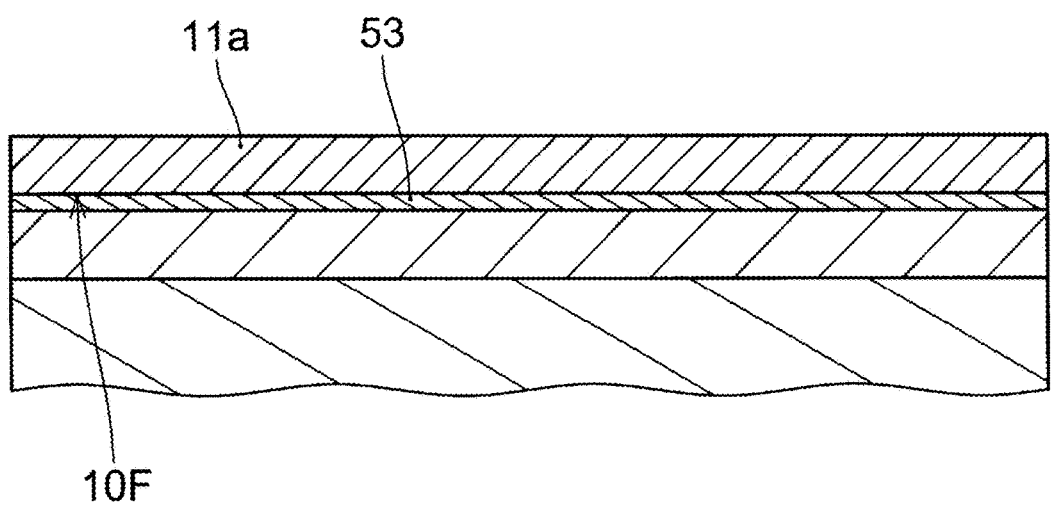
FIG. 4B illustrates a method for manufacturing a printed wiring board according to the embodiment of the present invention.

As illustrated in FIG. 4A, a base plate 51 is prepared, a metal foil 53 being provided on each surface of the base plate 51. The metal foil 53 has a carrier metal foil 52 adhered to one side of the metal foil 53. A surface of the carrier metal foil 52 on the opposite side of the metal foil 53 is bonded to a surface of the base plate 51 by thermocompression bonding. The metal foil 53 and the carrier metal foil 52 are adhered to each other by, for example, a separable adhesive such as a thermoplastic adhesive. It is also possible that the metal foil 53 and the carrier metal foil 52 are adhered to each other only in a margin portion near an outer periphery. A prepreg obtained, for example, by impregnating a core material such as a glass fiber with a resin material such as an epoxy resin is used for the base plate 51. The prepreg can be fully cured when being thermocompression-bonded to the carrier metal foil 52. It is also possible that a metal plate such as copper plate is used for the base plate 51. Further, it is also possible that a double-sided copper-clad laminated plate is used as the base plate 51 having the carrier metal foil 52. The metal foil 53 and the carrier metal foil 52 are preferably copper foils. Other metal foils such as a nickel foil may also be used. The metal foil 53 has a thickness of, for example, 3 μm or more and 10 μm or less. In FIG. 4A-4Q, it is not intended to illustrate exact ratios of thicknesses of the structural elements.

In the example of FIG. 4A, the metal foil 53 is provided on both one surface (51a) and the other surface (51b), which is on the opposite side of the one surface (51a), of the base plate 51. The laminate 10 (see FIGS. 1A, 2A and 3A) can be simultaneously formed on both front and back sides of the base plate 51. The printed wiring board 100 can be efficiently manufactured. However, the metal foil 53 is not necessarily required to be provided on both front and back sides of the base plate 51. In FIG. 4B-4I and the following description, illustration and description with respect to the other surface (51b) side of the base plate 51 are omitted. Further, in FIG. 4B-4I, only one laminate 10 on the one surface (51a) side of the base plate 51 is illustrated. However, it is also possible that multiple laminates 10 are formed on each of the one surface (51a) side and the other surface (51b) side of the base plate 51.

In the method for manufacturing the printed wiring board of the embodiment, the laminate 10 is formed from the first resin insulating layer (11a) side. First, as illustrated in FIG. 4B, the first resin insulating layer (11a) is formed on the metal foil 53. The first resin insulating layer (11a) is formed, for example, by thermocompression bonding a film-like epoxy resin or the like on the metal foil 53. A surface of the first resin insulating layer (11a) on the base plate 51 side forms the second surface (10F) of the laminate 10 (see FIG. 3A).

Figure 4C:
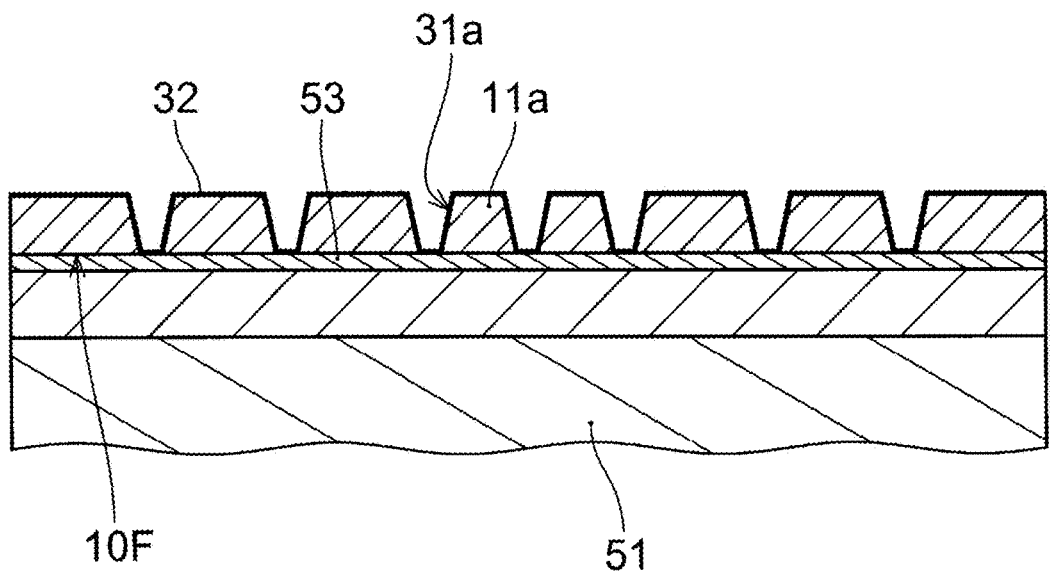
FIG. 4C illustrates a method for manufacturing a printed wiring board according to the embodiment of the present invention.

As illustrated in FIG. 4C, conduction holes (31a) penetrating the first resin insulating layer (11a) are respectively formed at formation locations of the first via conductors 13 and the second via conductors 14 (see FIG. 3A). The conduction holes (31a) are preferably formed by irradiating $CO_2$ laser to the formation locations of the conduction holes (31a) of the first resin insulating layer (11a). When laser is irradiated to the first resin insulating layer (11a) from a surface on the opposite side of the base plate 51, the conduction holes (31a) are formed each having a tapered shape that is gradually reduced in diameter toward the second surface (10F) side. In the case where the printed wiring board 1 or 2 illustrated in FIG. 1A or 2A is manufactured, the printed wiring board 1 or 2 includes the multiple first via conductors 13 on a center side in the first resin insulating layer (11a) of the laminate 10, but does not include via conductors on an outer peripheral side. Therefore, in the case where the printed wiring board 1 or 2 is manufactured, only the conduction holes (31a) are formed on the center side of the first resin insulating layer (11a).

Next, a metal layer 32 is formed in the conduction holes (31a) and on the surface of the first resin insulating layer (11a), for example, by chemical plating (electroless plating). The metal layer 32 may also be formed by sputtering, vacuum deposition or the like. A material of the metal layer 32 is also preferably copper, but is not limited to copper. For example, the metal layer 32 may be a Ti/Cr sputtered layer formed by sputtering. The metal layer 32 has a thickness of about 0.05 μm or more and 1.0 μm or less.

Figure 4D:
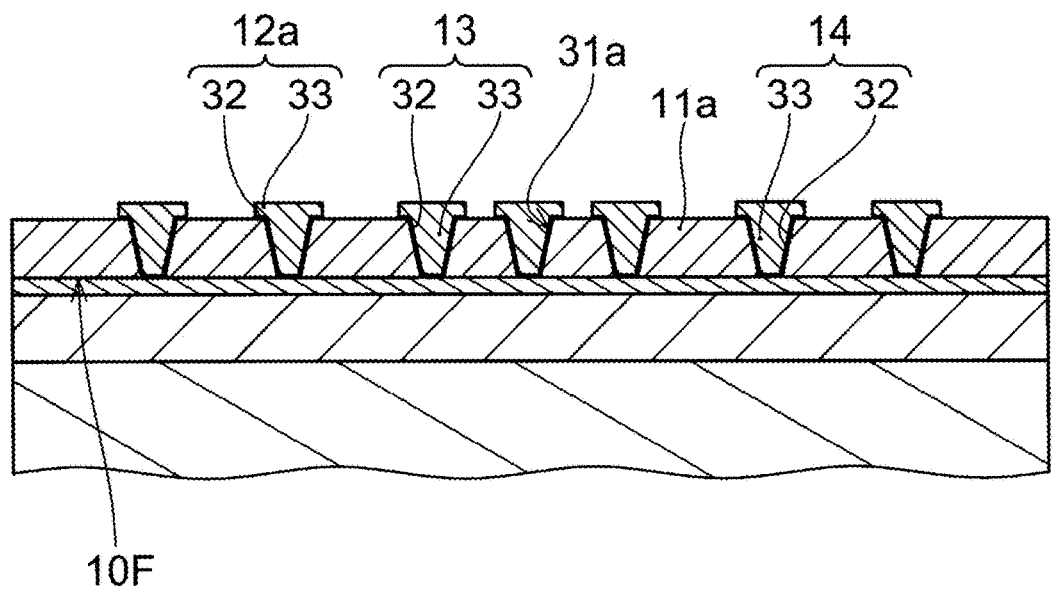
FIG. 4D illustrates a method for manufacturing a printed wiring board according to the embodiment of the present invention.

As illustrated in FIG. 4D, an electrolytic plating film 33 is formed by electrolytic plating using the metal layer 32 as a seed layer. The electrolytic plating film 33 is formed using a so-called pattern plating method or the like using a plating resist (not illustrated in the drawings) that has predetermined openings at formation regions of the conductor patterns of the first conductor layer (12a) and at positions of the conduction holes (31a). After the formation of the electrolytic plating film 33, the plating resist (not illustrated in the drawings) is removed. Then, the metal layer 32 exposed by the removal of the plating resist is removed by etching. As a result, the first conductor layer (12a) is formed by the metal layer 32 on the first resin insulating layer (11a) and the electrolytic plating film 33 on the first resin insulating layer (11a) and on the conduction holes (31a). Further, the first via conductors 13 are formed by the metal layer 32 and the electrolytic plating film 33 in the conduction holes (31a) on the center side of the first resin insulating layer (11a). Similarly, the second via conductors 14 are formed in the conduction holes (31a) on the outer peripheral side of the first resin insulating layer (11a). Since the conduction holes (31a) each have a tapered shape that is gradually reduced in diameter toward the second surface (10F) side, along the shape of the conduction holes (31a), the first and second via conductors (13, 14) each having a shape that is gradually reduced in diameter toward the second surface (10F) side can be formed.

Figure 4E:
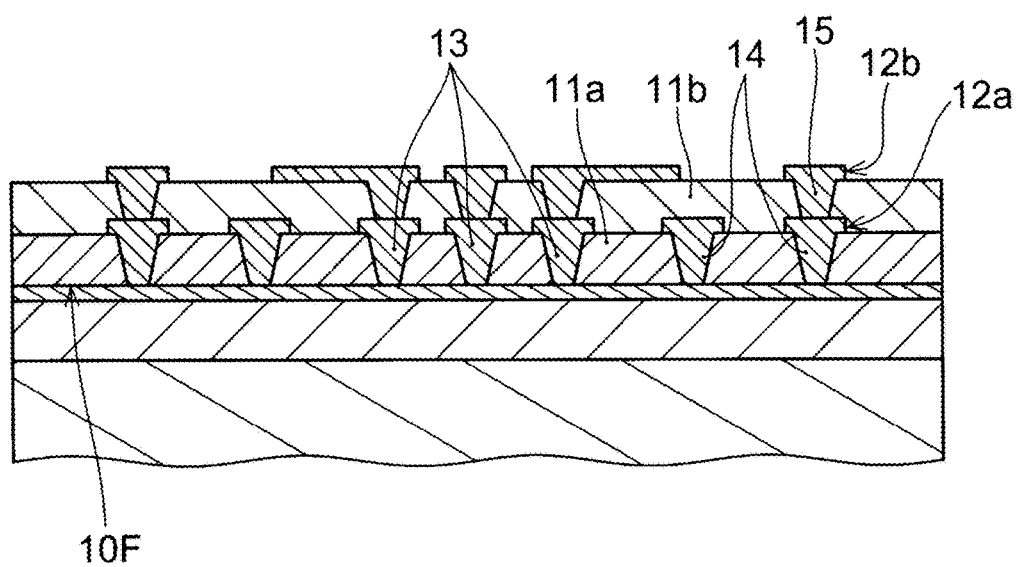
FIG. 4E illustrates a method for manufacturing a printed wiring board according to the embodiment of the present invention.

As illustrated in FIG. 4E, by repeating processes similar to the processes of FIG. 4B-4D, the second resin insulating layer (11b), the second conductor layer (12b), and the third via conductors 15 are formed on the first resin insulating layer (11a) and the first conductor layer (12a), the third via conductors 15 each having a shape that is gradually reduced in diameter toward the second surface (10F) side. In FIG. 4E, the first conductor layer (12a) and the second conductor layer (12b) are each simplified as one layer in the illustration. Also in FIG. 4F-4Q, the conductor layers are similarly simplified in the illustration.

Figure 4F:
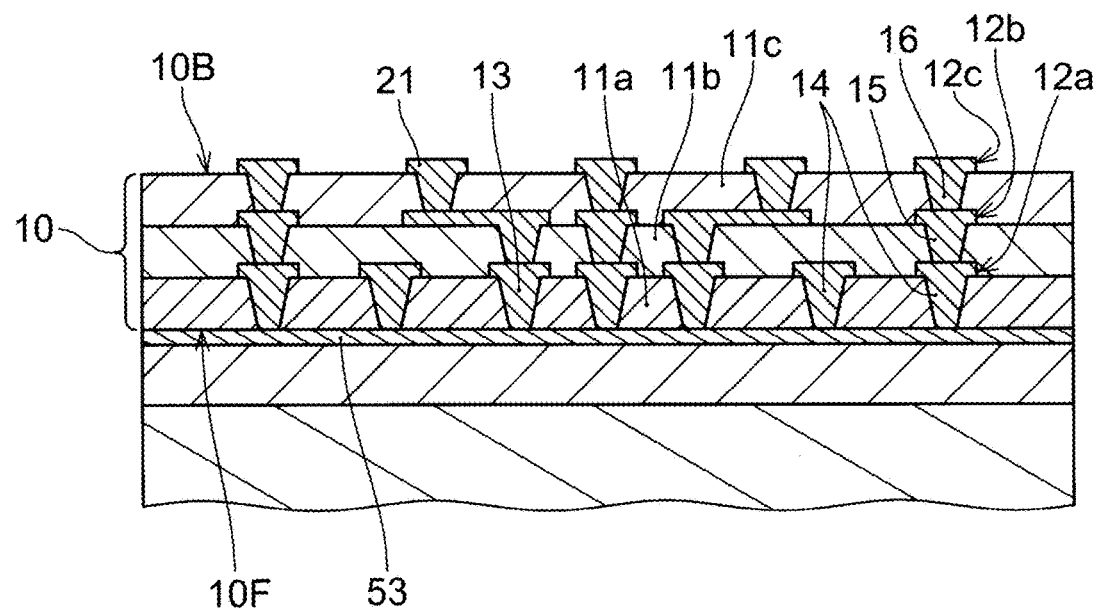
FIG. 4F illustrates a method for manufacturing a printed wiring board according to the embodiment of the present invention.

Further, as illustrated in FIG. 4F, by repeating processes similar to the processes of FIG. 4B-4D, the third resin insulating layer (11c), the third conductor layer (12c) and the fourth via conductors 16 are formed on the second resin insulating layer (11b) and the second conductor layer (12b), the fourth via conductors 16 each having a shape that is gradually reduced in diameter toward the second surface (10F) side.

By the above formation of the resin insulating layers and the conductor layers, the laminate 10 is formed on the metal foil 53. The laminate 10 has the second surface (10F), which is on the metal foil 53 side and is formed by the first resin insulating layer (11a), and the first surface (10B), which is on the opposite side of the second surface (10F) and is formed by the third resin insulating layer (11c). In the third conductor layer (12c), which is positioned on the most first surface (10B) side, the multiple first conductor pads 21 are formed protruding on the first surface (10B). When the printed wiring board 100 has a different number of pairs of resin insulating layers and conductor layers from the laminate 10 illustrated in FIG. 3A, the number of repetitions of the processes illustrated in FIG. 4B-4D is appropriately adjusted. For example, when a printed wiring board having only one pair of a resin insulating layer and a conductor layer is manufactured, the processes of FIG. 4B-4D are not repeated.

Materials for the first-third conductor layers (12a-12c) and the first-fourth via conductors (13-16) are not particularly limited as long as the materials have good conductivity and allow the first-third conductor layers (12a-12c) and the first-fourth via conductors (13-16) to be easily formed by plating and easily removed by etching. Examples of the materials for the conductor layers and the via conductors include copper, nickel and the like, and copper is preferably used. As described above, materials for the first-third resin insulating layers (11a-11c) are not particularly limited as long as the materials have good insulating properties and the like. In addition to the above-described epoxy resin, bismaleimide triazine resin (BT resin), phenol resin and the like can be used. A resin material that forms the resin insulating layers may contain inorganic filler such as silica.

Figure 4G:
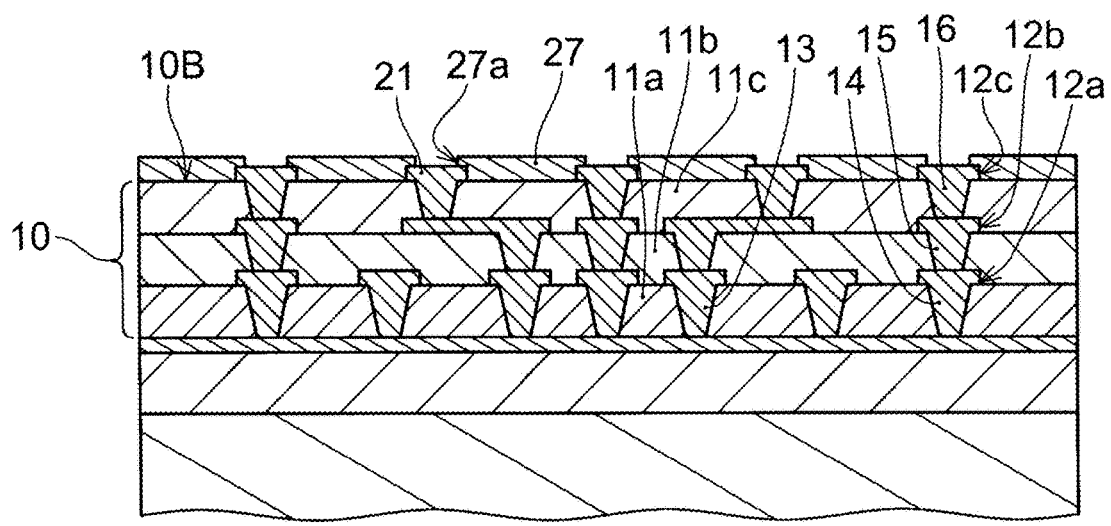
FIG. 4G illustrates a method for manufacturing a printed wiring board according to the embodiment of the present invention.

As illustrated in FIG. 4G, the solder resist layer 27 having the openings (27a) on the first conductor pads 21 is formed. The solder resist layer 27 is formed on the surface of the third resin insulating layer (11c) exposed without being covered by the third conductor layer (12c) and on outer edge portions of the first conductor pads 21. For example, a layer of a photosensitive epoxy resin is formed on the third conductor layer (12c) and on the third resin insulating layer (11c) by printing, spray coating or the like, and the openings (27a) are formed using a photolithography technology. A material of the solder resist layer 27 is not particularly limited. Preferably, an epoxy resin containing 40-70% by weight of inorganic filler such as silica is used.

Figure 4H:
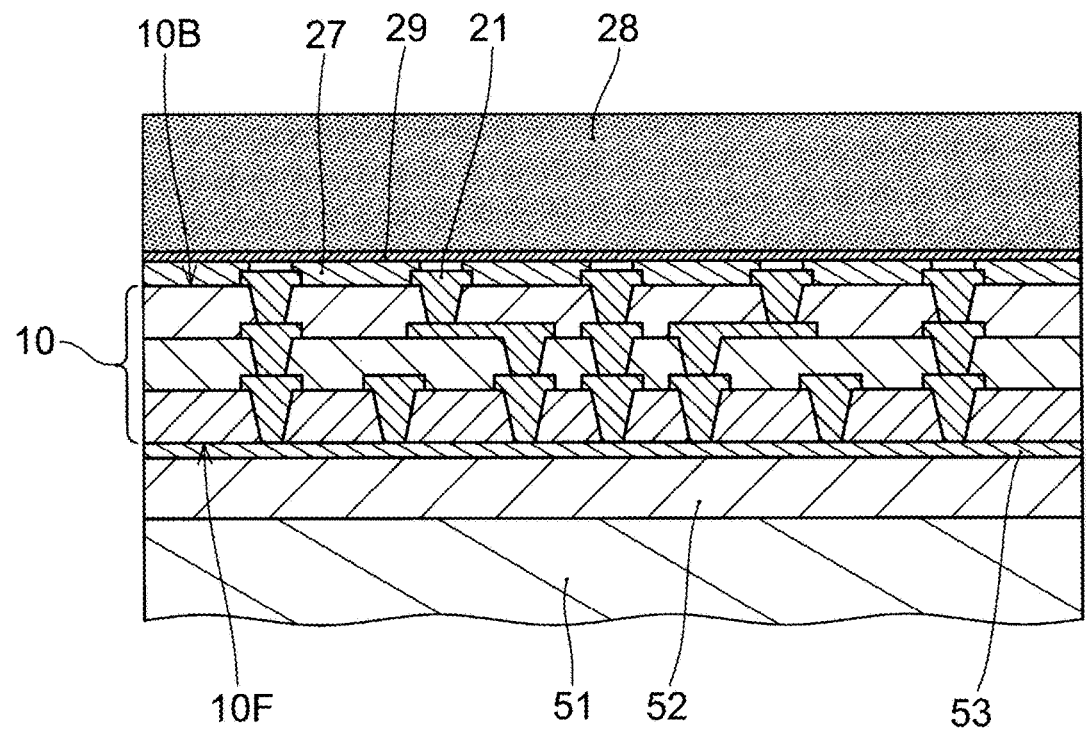
FIG. 4H illustrates a method for manufacturing a printed wiring board according to the embodiment of the present invention.

As illustrated in FIG. 4H, the support plate 28 is provided on the first surface (10B) side of the laminate 10 with the solder resist layer 27 sandwiched therebetween. The laminate 10, after a removal process (to be described later) of the base plate 51 and the carrier metal foil 52, is supported by the support plate 28. For example, the support plate 28 can function as a support member for the laminate 10 during subsequent processes (to be described later) of the printed wiring board 100 and during mounting of an electronic component on the connection pads 22 or the conductor posts 25 (see FIG. 3A). A material having appropriate rigidity can be used as the support plate 28. For example, as the support plate 28, a glass epoxy substrate obtained by curing a prepreg, or a metal plate similar to the base plate 51, or a double-sided copper-clad laminated plate, or the like, can be used.

The adhesive layer 29 having adequate adhesiveness (adhesion) with respect to the solder resist layer 27 is provided on a bonding surface of the support plate 28 and/or the solder resist layer 27. Due to the adhesiveness of the adhesive layer 29, the support plate 28 and the solder resist layer 27 are adhered to each other. When necessary, the adhesive layer 29 is cured by heating or the like. As described above, preferably, a material that does not develop a strong adhesive force with respect to the solder resist layer 27 and the third conductor layer (12c) but has moderate adhesion is used as the material of the adhesive layer 29.

Figure 4I:
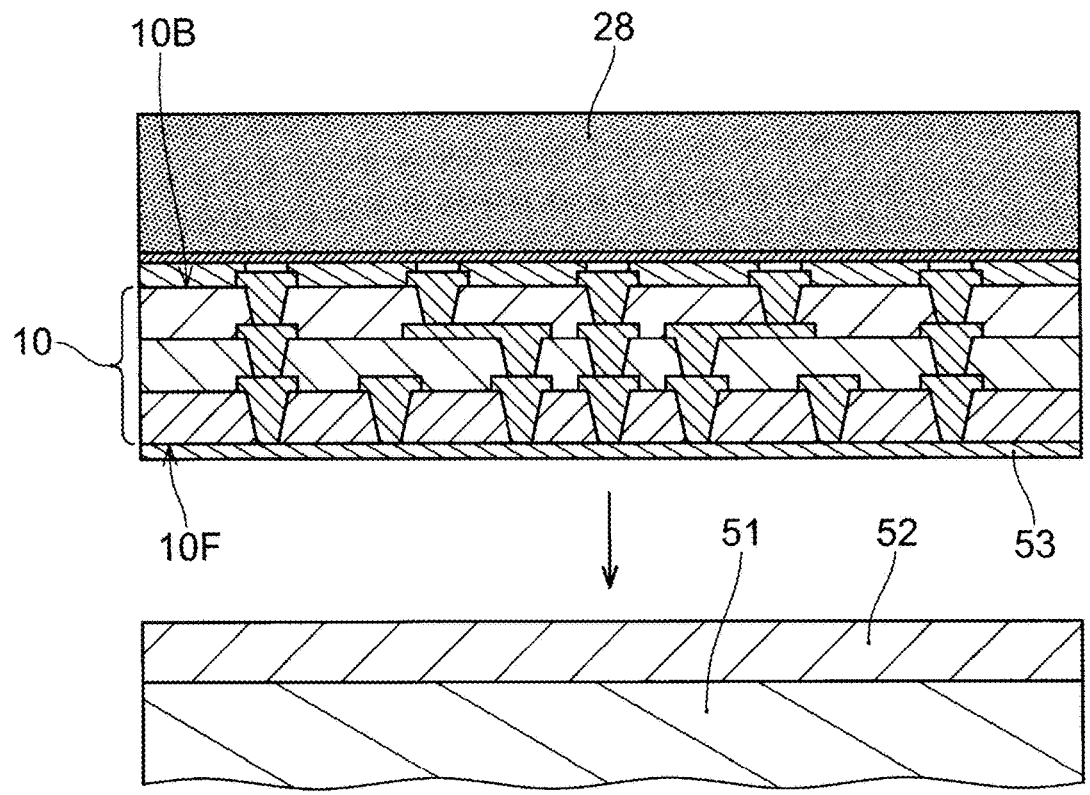
FIG. 4I illustrates a method for manufacturing a printed wiring board according to the embodiment of the present invention.

Next, as illustrated in FIG. 4I, the base plate 51 and the carrier metal foil 52 are removed. In the case where the conductor layers and the like are formed on both sides of the base plate 51, by removing the base plate 51 and the carrier copper foil 52, two laminates 10 are obtained. As described above, the carrier metal foil 52 and the metal foil 53 are adhered to each other by a thermoplastic resin or the like. Therefore, for example, by raising temperature and applying a force, the base plate 51 and the carrier metal foil 52 can be easily separated from the metal foil 53. As a result, a bonding surface of the metal foil 53 to the carrier metal foil 52 is exposed. When the carrier metal foil 52 and the metal foil 53 are adhered to each other only in a peripheral margin portion, the two can be easily separated from each other by cutting an inner side of the adhering portion. Further, it is also possible to separate the base plate 51 and the laminate 10 from each other by simply pulling the two in mutually opposite directions. The metal foil 53 is exposed on the entire surface on the second surface (10F) side of the laminate 10.

Figure 4J:
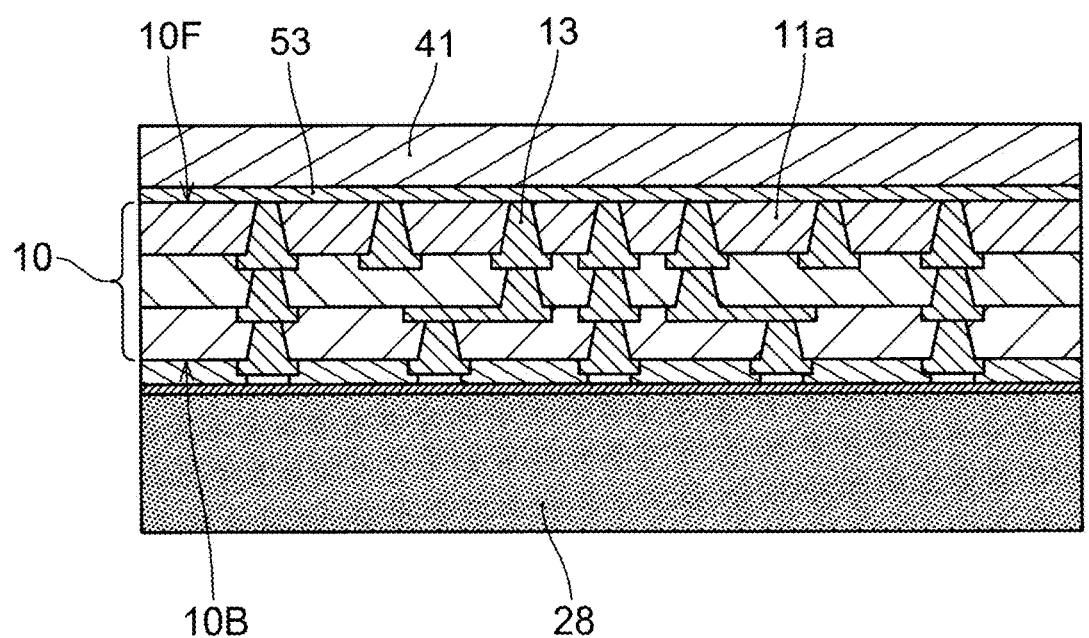
FIG. 4J illustrates a method for manufacturing a printed wiring board according to the embodiment of the present invention.

Next, as illustrated in FIG. 4J, an etching resist layer 41 is fixated on the entire exposed surface of the metal foil 53 on the opposite side of the laminate 10. When the printed wiring board (1 or 2) (see FIGS. 1A and 2A) that does not include via conductors on an outer peripheral side of the multiple first via conductors 13, it is also possible that the etching resist layer 41 is not formed. In this case, the metal foil 53 exposed by being separated from the carrier metal foil 52 is removed by etching or the like. As a result, the second surface (10F) of the laminate 10 is exposed. At the same time, the end surfaces of the first via conductors 13 on the second surface (10F) side are also exposed. By continuing etching even after the metal foil 53 disappears, the exposed end surfaces of the first via conductors 13 are etched. As a result, as illustrated in FIG. 1A, the printed wiring board 1 is formed that includes the first via conductors 13 having the end surfaces (13a) recessed from the second surface (10F) of the laminate 10. As will be described later, by respectively forming the surface treatment layers (22a) on the end surfaces (13a), the printed wiring board 2 illustrated in FIG. 2A is completed that includes the connection pads 22 that respectively include the surface treatment layers (22a).

Figure 4K:
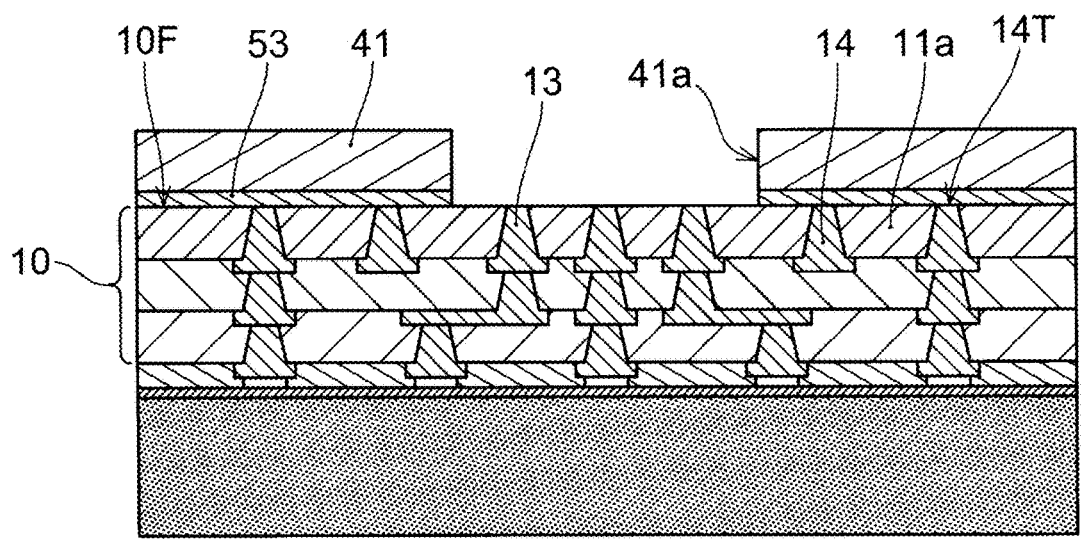
FIG. 4K illustrates a method for manufacturing a printed wiring board according to the embodiment of the present invention.
Figure 4L:
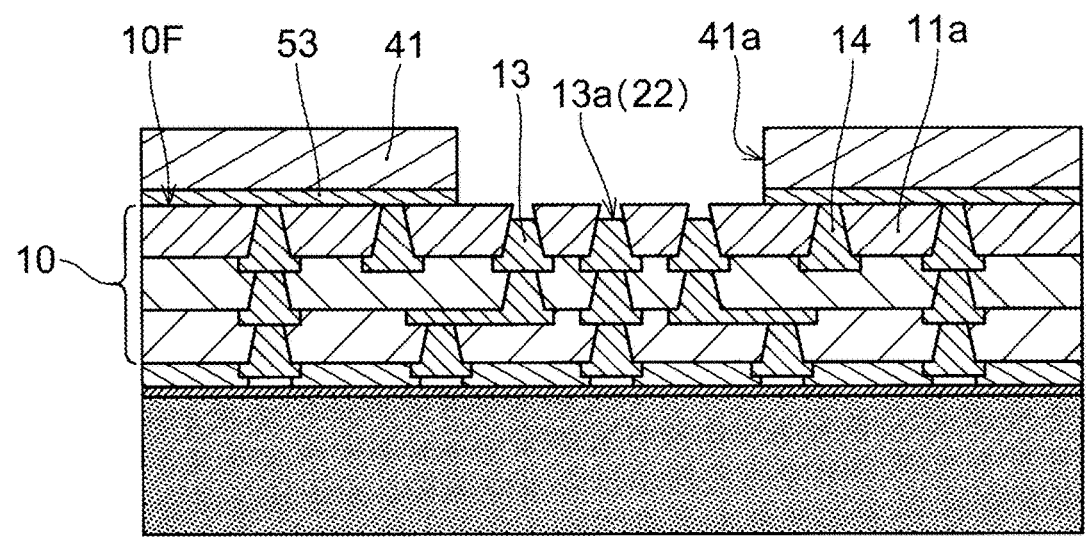
FIG. 4L illustrates a method for manufacturing a printed wiring board according to the embodiment of the present invention.

In the case where the printed wiring board 100 illustrated in FIG. 3A is manufactured, following the process illustrated in FIG. 4J, an opening (41a) is provided in the etching resist layer 41, as illustrated in FIG. 4K. A portion of the etching resist layer 41 on a center portion of the first resin insulating layer (11a), where the multiple first via conductors 13 are formed, is removed. A portion of the metal foil 53 on the first via conductors 13 is exposed on a bottom surface of the opening (41a). On the other hand, an opening (41a) is not formed on the second via conductors 14. The portion of the metal foil 53 exposed in the opening (41a) is removed by etching. As illustrated in FIG. 4K, a center portion of the second surface (10F) of the laminate 10, including the end surfaces of the multiple first via conductors 13, is exposed. On the other hand, the end surfaces (14T) of the second via conductors 14 are covered by the etching resist layer 41 and the metal foil 53 and are not exposed. By continuing etching even after the metal foil 53 disappears, the end surfaces of the first via conductors 13 on the small-diameter side, exposed on the second surface (10F) of the laminate 10, are etched. As illustrated in FIG. 4L, the connection pads 22 are formed by the end surfaces (13a) of the first via conductors 13 recessed from the second surface (10F) of the laminate 10.

Figure 4M:
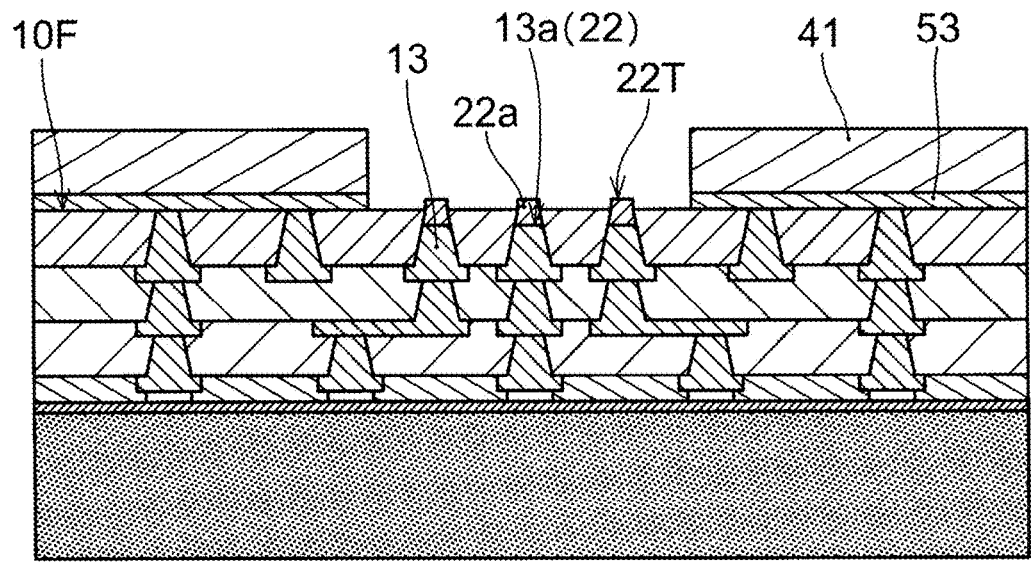
FIG. 4M illustrates a method for manufacturing a printed wiring board according to the embodiment of the present invention.

As illustrated in FIG. 4M, the surface treatment layer (22a) is formed on the end surface (13a) of each of the first via conductors 13. For example, by electroless plating, a first plating layer composed of nickel is formed on the end surface (13a), a second plating layer composed of palladium is formed on the first plating layer, and a plating layer composed of gold is formed on the second plating layer. However, the materials of the plating layers are not limited to these. The surface treatment layer (22a) is formed by the laminate of the plating layers formed on the end surface (13a). Thicknesses of the plating layers are not particularly limited. However, the surface treatment layer (22a) is preferably formed such that the upper surface (22T) of the surface treatment layer (22a) on the opposite side of the end surface (13a) protrudes from the second surface (10F). After the formation of the surface treatment layer (22a), the etching resist layer 41 is removed. A portion of the metal foil 53 that remains without being etched in the process illustrated in FIG. 4K is exposed.

Figure 4N:
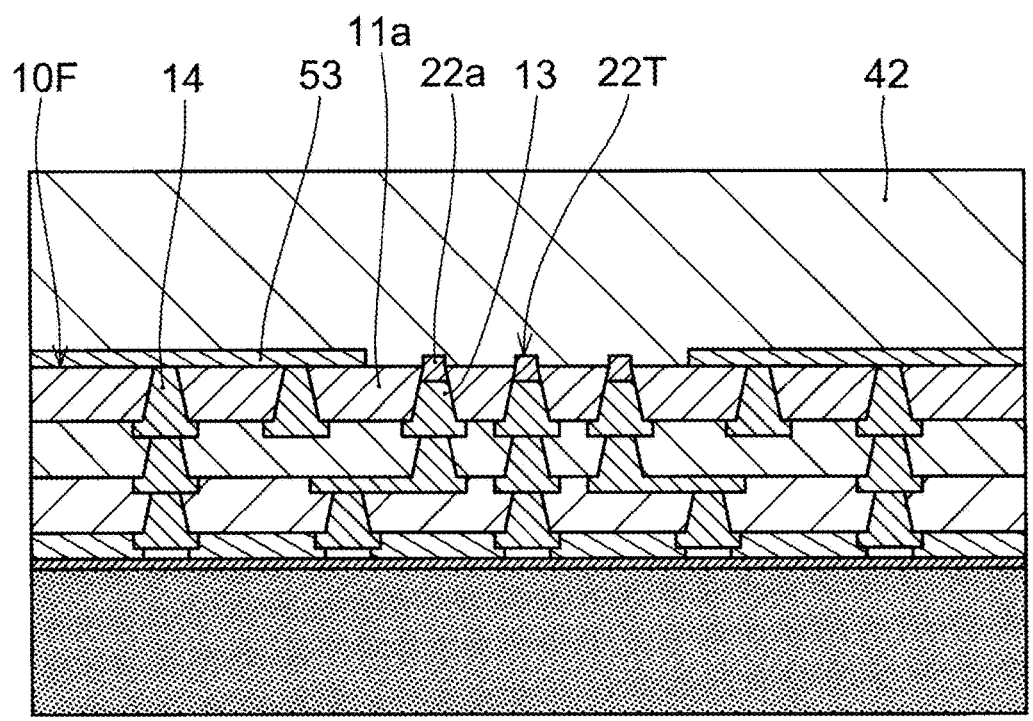
FIG. 4N illustrates a method for manufacturing a printed wiring board according to the embodiment of the present invention.
Figure 4O:
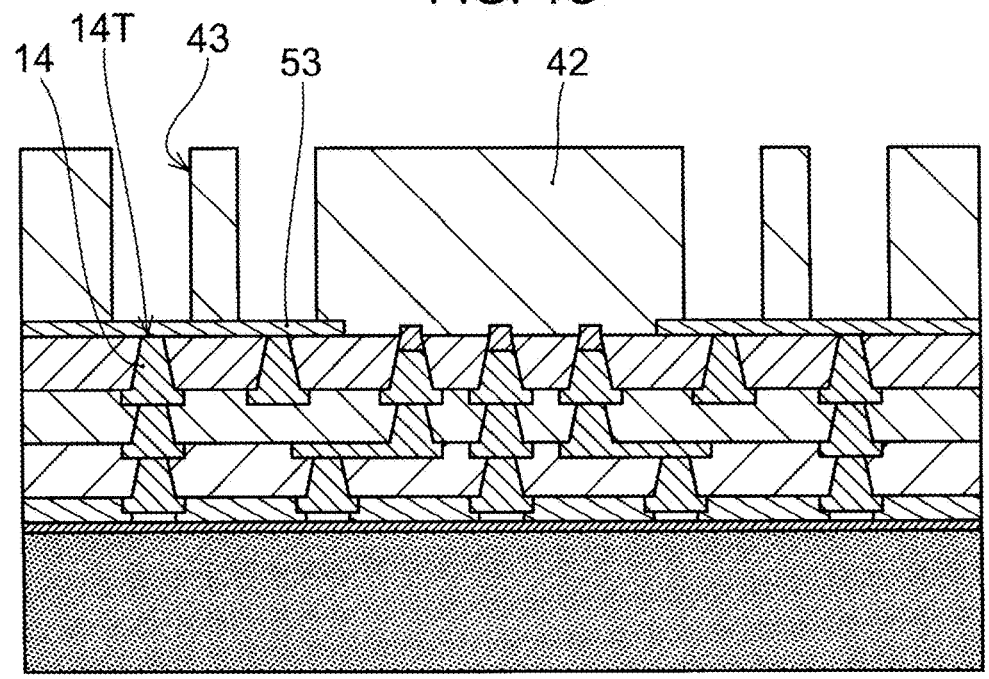
FIG. 4O illustrates a method for manufacturing a printed wiring board according to the embodiment of the present invention.

Next, the conductor posts 25 are respectively formed on the second via conductors 14. First, as illustrated in FIG. 4N, a plating resist layer 42 is formed on the metal foil 53, on the first resin insulating layer (11a) exposed from the metal foil 53, and on the upper surfaces (22T) of the surface treatment layers (22a) protruding from the second surface (10F). As illustrated in FIG. 4O, openings 43 are formed, for example, by exposure and development, in the plating resist layer 42 at portions where the conductor posts 25 are to be formed. The metal foil 53 is exposed at bottom surfaces of the openings 43. The openings 43 are formed such that a diameter of each of the openings 43 is larger than a diameter of the end surface (14T) of each of the second via conductors 14. Therefore, the diameter of each of the conductor posts 25 that are formed along shapes of the openings 43 can be larger than the diameter of the end surface (14T) of each of the second via conductors 14.

Figure 4P:
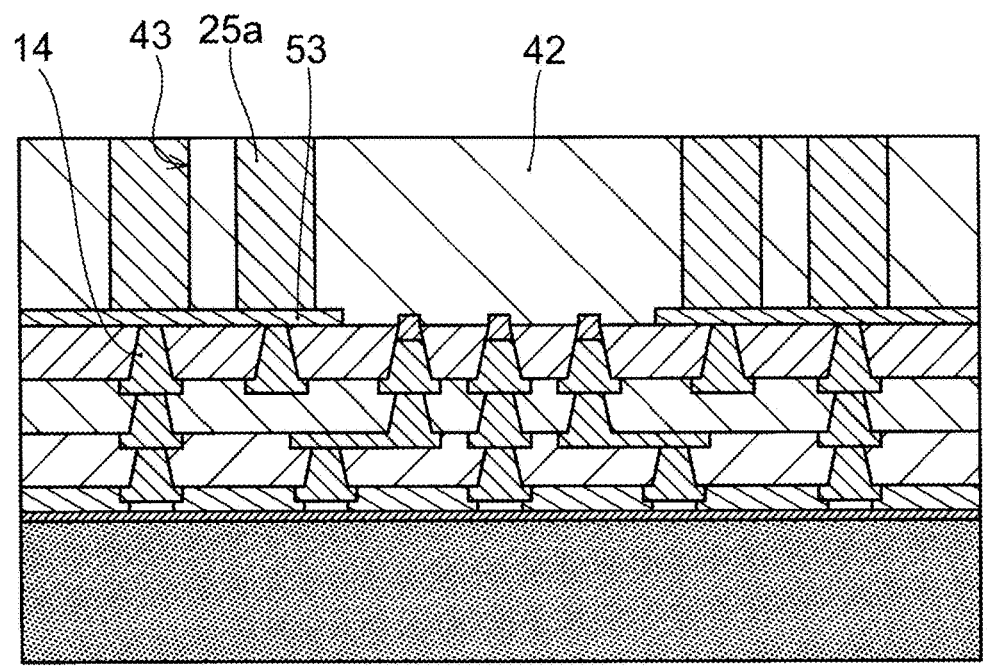
FIG. 4P illustrates a method for manufacturing a printed wiring board according to the embodiment of the present invention.
Figure 4Q:
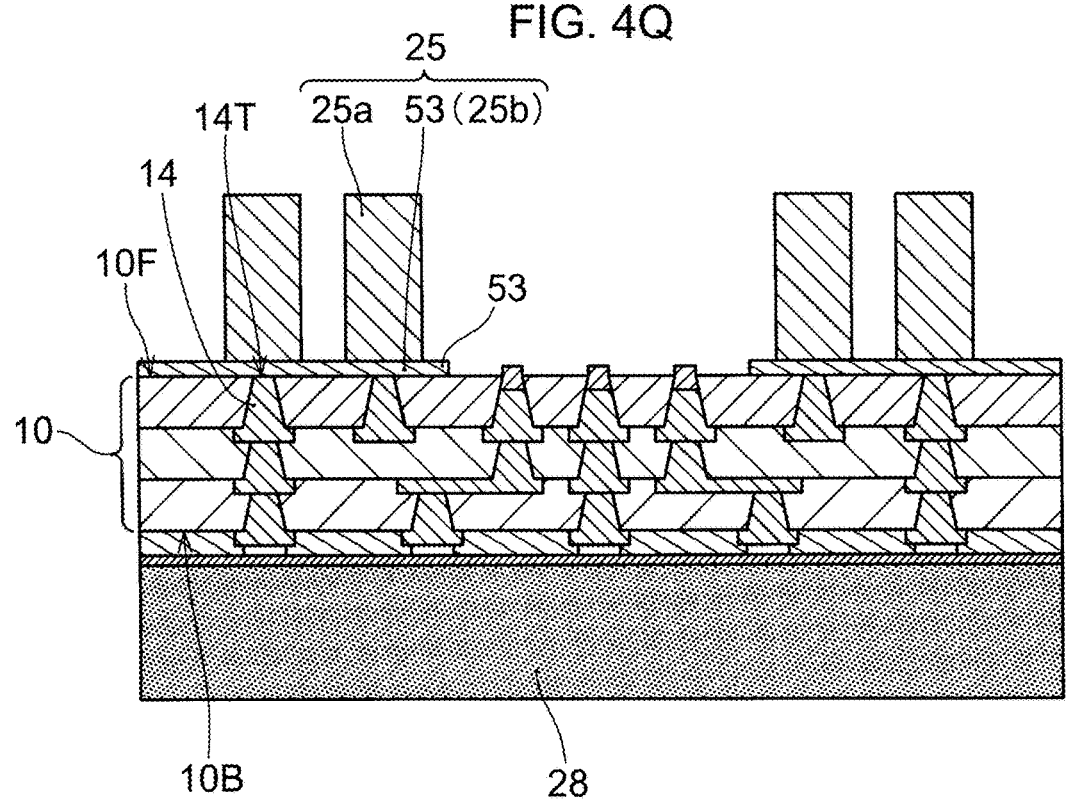
FIG. 4Q illustrates a method for manufacturing a printed wiring board according to the embodiment of the present invention.

The plating resist layer 42 can be formed to have a thickness substantially equal to or slightly larger than a length of each of the conductor posts 25. As illustrated in FIG. 4P, the plating film layers (25a) are formed, by electrolytic plating using the metal foil 53 remaining on the second via conductors 14 as a power feeding layer, on the metal foil 53 exposed in the openings 43 of the plating resist layer 42. The plating film layers (25a) are respectively connected to the second via conductors 14 via the metal foil 53.

Thereafter, as illustrated in FIG. 4Q, the plating resist layer 42 is removed. Next, the metal foil 53 exposed by the removal of the plating resist layer 42 is removed by etching. The plating film layers (25a) respectively mask portions of the metal foil 53 below the plating film layers (25a) during the removal of the metal foil 53 by etching. The portions of the metal foil 53 that are respectively masked by the plating film layers (25a) remain without being removed. The conductor posts 25 are formed by the remaining portions of the metal foil 53, that is, the metal foil layers (25b), and the plating film layers (25a). Since the diameter of each of the plating film layers (25a) is larger than the diameter of the end surface (14T) of each of the second via conductors 14, a diameter of each of the metal foil layers (25b) can also be larger than the diameter of the end surface (14T) of each of the second via conductors 14. The conductor posts 25 each having a diameter larger than the diameter of the end surface (14T) of each of the second via conductors 14 are formed. The printed wiring board 100 illustrated in FIG. 3A is completed.

A material of the conductor posts 25 is not particularly limited. Copper that is inexpensive and low in electrical resistance is preferable. Examples of a plating solution for forming the plating film layers (25a) composed of copper include a copper sulfate plating solution and the like. A length (thickness of plating) of each of the plating film layers (25a) can be controlled by a plating time. The conductor posts 25 having a desired height can be formed. Preferably, the plating film layers (25a) and the metal foil 53 are formed of the same material. The conductor posts 25 having high strength can be formed.

It is also possible that, support plates 28 of laminates 10, to each of which a support plate 28 is adhered, are bonded to each other, and, for example, subsequent processes of printed wiring boards 100 on the support plates 28 are simultaneously performed. For example, the formation of the conductor posts 25 on the end surfaces (14T) of the second via conductors 14 can be simultaneously performed on the laminates 10 on both sides. Specifically, after the process of adhering the support plate 28 to the laminate 10 illustrated in FIG. 4H, two support plates 28 are bonded to each other such that the exposed surfaces of the support plates 28 on opposite sides of the solder resist layers 27 facing each other. For example, the support plates 28 can be bonded to each other by a peelable adhesive or the like. Or, it is also possible that the two support plates 28 sandwich another support plate and are respectively bonded to both sides of the other support plate. Then, the surface treatment layers (22a) and the conductor posts 25 are formed using the method described with reference to FIG. 4J-4Q on the end surfaces (13a) of the first via conductors 13 and on the end surfaces (14T) of the second via conductors 14 of each of the laminates 10 on the two bonded support plates 28. Thereafter, for example, after removing the metal foil 53, the two support plates 28 are separated. Since the conductor posts 25 can be substantially simultaneously formed on the laminates 10 on the both sides, printed wiring boards can be more efficiently manufactured.

Figure 4R:
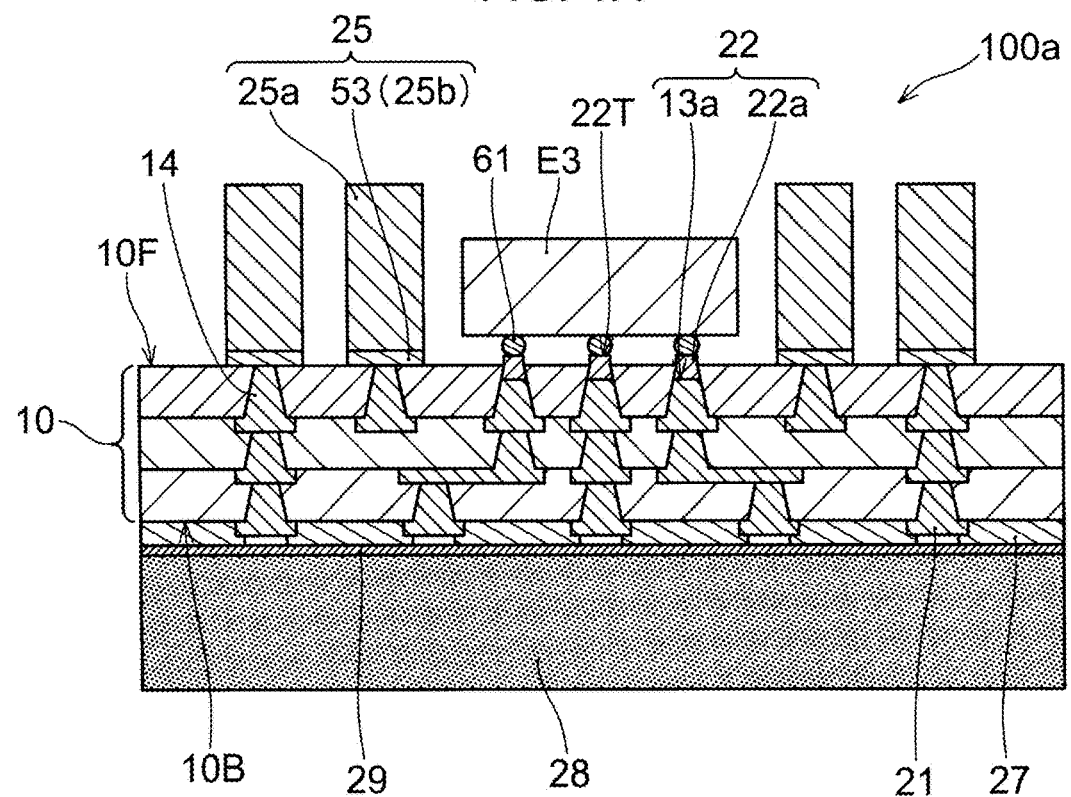
FIG. 4R illustrates an example of mounting an electronic component in a method for manufacturing a printed wiring board according to the embodiment of the present invention.

In the case where the printed wiring board (100a) having an electronic component illustrated in FIG. 3B is manufactured, the electronic component (E3) is mounted on the surface treatment layers (22a) of the connection pads 22 of the completed printed wiring board 100. As illustrated in FIG. 4R, the electronic component (E3) is positioned on the second surface (10F) of the laminate 10 such that the terminals of the electronic component (E3) are respectively positioned on the surface treatment layers (22a) of the connection pads 22 via the bonding members 61. Before the positioning of the electronic component (E3), a solder paste or the like may be supplied onto the connection pads 22. Together with the electronic component (E3), the printed wiring board 100 is heated in a reflow furnace or a high temperature tank or the like, and the electronic component (E3) is connected to the connection pads 22. Since the electronic component (E3) is mounted in a state in which the laminate 10 is supported by the support plate 28, the electronic component (E3) can be properly mounted on the printed wiring board 100. Further, a motherboard or another printed wiring board (not illustrated in the drawings) may be connected to the end surfaces (25T) of the conductor posts 25 so as to form a part of a semiconductor package.

As illustrated in FIG. 4S, the support plate 28 may be peeled off from the laminate 10 after the electronic component (E3) is mounted. As a result, the first conductor pads 21 are exposed, and connection between an external electrical circuit and the first conductor pads 21 is facilitated.

Further, although not illustrated in FIG. 4R, as in the example of FIG. 2C, after the electronic component (E3) is mounted on the connection pads 22, a resin sealing layer (M) covering around the electronic component (E3) may be formed. The resin sealing layer (M) can be formed, for example, by supplying a flowable mold resin mainly composed of an epoxy resin or the like to an upper surface and surrounding areas of the electronic component (E3) and applying heat when necessary. The resin sealing layer (M) may be formed using any other method such as laminating and heating a resin film on the electronic component (E3). Further, it is also possible that a so-called underfill-like resin sealing layer, which fills only a gap between the electronic component (E3) and the laminate 10, is formed. In the case where the resin sealing layer (M) is formed, as in the example of FIG. 2C, the support plate 28 may be peeled off after the formation of the resin sealing layer (M), or may be peeled off before the formation of the resin sealing layer (M).

As described above, the adhesive layer 29 that closely adheres the support plate 28 and the laminate 10 to each other is preferably formed of a material that does not have strong adhesion with respect to the solder resist layer 27. In this case, the support plate 28 and the laminate 10 can be easily separated from each other by pulling the two in mutually opposite directions. Depending on adhesive properties of the adhesive layer 29, the support plate 28 and the laminate 10 may be pulled apart from each other while ultraviolet irradiation or heating is performed, or after ultraviolet irradiation or heating is performed. As described above, after the electronic component (E3) is mounted, the support plate 28 can be removed, for example, at an appropriate timing up to a process of connecting the first conductor pads 21 and an external electrical circuit.

Further, the method for manufacturing the printed wiring board of the embodiment is not limited the method described with reference to FIG. 4A-4S. With respect to the method for manufacturing the printed wiring board of the embodiment, it is possible that a process other than the processes described above is added, and it is also possible that some of the processes described above are omitted.

A multilayer wiring board of Japanese Patent Laid-Open Publication No. 2009-224739 does not have a core substrate and is formed from only the insulating layer, the wiring layer, and the protective film, which are mainly formed of resin, and warping is likely to occur during mounting of a semiconductor element or the like. Further, since the connection pads are provided protruding from the insulating layer that forms a surface, when a solder resist layer is not formed, an insulator is not interposed between adjacent connection pads. Therefore, a short-circuit defect between adjacent connection pads is likely to occur due to wet spreading of a bonding material such as solder. In particular, for a wiring board in which connection pads are provided at a fine pitch, it may be difficult to form a solder resist between adjacent connection pads. A short-circuit defect is even more likely to occur.

A printed wiring board according to an embodiment of the present invention includes a laminate that includes alternately laminated conductor layers and resin insulating layers. The laminate has a first surface and a second surface that is on the opposite side of the first surface, and has multiple first conductor pads formed on the first surface and multiple via conductors penetrating the resin insulating layers of the laminate. The multiple via conductors are gradually reduced in diameter from the first surface side toward the second surface side. Among the multiple via conductors, multiple first via conductors having end surfaces on the second surface side exposed on the second surface of the laminate are formed in a first resin insulating layer that forms the second surface of the laminate. The end surfaces of the first via conductors are recessed from the second surface of the laminate. A solder resist layer having openings that respectively expose the first conductor pads are formed on the first surface of the laminate. A support plate is provided on the first surface of the laminate with the solder resist layer sandwiched therebetween.

A method for manufacturing a printed wiring board according to an embodiment of the present invention includes: forming a laminate of conductor layers and resin insulating layers by laminating, on a metal foil provided on a base plate, at least one pair of a resin insulating layer and a conductor layer, the laminate having a second surface on the metal foil side and a first surface on the opposite side of the second surface; forming a solder resist layer on the first surface of the laminate; providing a support plate on the first surface of the laminate with the solder resist layer sandwiched therebetween; removing the base plate; and removing the metal foil by etching. The forming of the laminate includes: forming multiple first via conductors that penetrate a first resin insulating layer laminated on the metal foil; and forming multiple first conductor pads in an outermost conductor layer on the first surface side. The removing of the metal foil includes recessing, relative to the second surface of the laminate, end surfaces of the multiple first via conductors exposed by removal of the metal foil.

According to an embodiment of the present invention, connection pads are formed by the end surfaces of the via conductors formed in the resin insulating layer that forms the surface on the opposite side of the support plate. The connection pads can be formed at a fine pitch on the surface on the opposite side of the support plate. The connection pads are embedded in the resin insulating layer, and the solder resist layer is formed on the support plate side. Therefore, occurrence of a short-circuit defect between the pads can be suppressed on both sides of the printed wiring board. Further, due to the support plate, warpage or deflection of the printed wiring board is suppressed, and thus, an electronic component can be properly mounted.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a support plate;
   a laminate formed on the support plate and comprising a plurality of first conductor pads on a first surface side of the laminate and a plurality of first via conductors on a second surface side of the laminate; and
   a solder resist layer interposed between the support plate and the laminate and having a plurality of openings formed such that the solder resist layer and the support plate are positioned on the first surface side of the laminate and that the openings of the solder resist layer are exposing the first conductor pads on the first surface side of the laminate respectively,
   wherein the laminate has a first surface on the first surface side and a second surface on the second surface side on an opposite side with respect to the first surface of the laminate and includes a first resin insulating layer forming the second surface of the laminate, and the plurality of first via conductors is formed through the first resin insulating layer such that the first via conductors are tapering from the first surface side toward the second surface side of the laminate and have end surfaces recessed from the second surface of the laminate on the second surface side of the laminate respectively.

2. A printed wiring board according to claim 1, wherein the plurality of first conductor pads is formed on the first surface of the laminate.

3. A printed wiring board according to claim 1, wherein the second surface of the laminate is not covered with a solder resist layer.

4. A printed wiring board according to claim 1, further comprising:
   an electronic component connected to the plurality of the end surfaces of the first via conductors such that the electronic component is mounted on the second surface side of the laminate.

5. A printed wiring board according to claim 1, wherein the plurality of first via conductors is formed such that each of the first via conductors has a surface treatment layer formed on a respective one of the end surfaces.

6. A printed wiring board according to claim 5, wherein the surface treatment layer is formed on a respective one of the end surfaces of the first via conductors such that the surface treatment layer has a surface protruding from the second surface of the laminate.

7. A printed wiring board according to claim 6, wherein the surface treatment layer has the surface formed at a height in a range of 1 μm to 5 μm from the second surface of the laminate.

8. A printed wiring board according to claim 1, wherein the plurality of first via conductors is formed on a center side of the second surface of the laminate, and the laminate includes a plurality of second via conductors formed through the first resin insulating layer of the laminate such that the second via conductors are positioned on an outer peripheral side than the plurality of first via conductors.

9. A printed wiring board according to claim 8, wherein the plurality of first via conductors is formed such that the plurality of first via conductors has a pitch that is smaller than a pitch of the plurality of second via conductors.

10. A printed wiring board according to claim 8, further comprising:
    a plurality of conductor posts formed on the second surface side of the laminate such that the conductor posts are formed on the second via conductors respectively and that the conductor posts and the second via conductors have interfaces coplanar with respect to the second surface of the laminate.

11. A printed wiring board according to claim 10, wherein the conductor posts comprise metal film layer portions formed in contact with the second via conductors and plating layer portions formed on the metal film layer portions respectively.

12. A printed wiring board according to claim 10, wherein the laminate includes a via conductor structure penetrating from the first surface to the second surface of the laminate such that the via conductor structure, one of the conductor posts and one of the first conductor pads are formed in overlapping positions and that the via conductor structure is connecting the one of the conductor posts and the one of the first conductor pads.

13. A printed wiring board according to claim 10, wherein the plurality of conductor posts has a height in a range of 50 μm to 200 μm.

14. A printed wiring board according to claim 2, further comprising:
- an electronic component connected to the plurality of the end surfaces of the first via conductors such that the electronic component is mounted on the second surface side of the laminate.

* * * * *